United States Patent
Wang et al.

(10) Patent No.: US 11,515,842 B2
(45) Date of Patent: Nov. 29, 2022

(54) DOHERTY POWER AMPLIFIERS AND DEVICES WITH LOW VOLTAGE DRIVER STAGE IN CARRIER-PATH AND HIGH VOLTAGE DRIVER STAGE IN PEAKING-PATH

(71) Applicant: NXP USA, Inc.

(72) Inventors: Lu Wang, Chandler, AZ (US); Elie A Maalouf, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 183 days.

(21) Appl. No.: 17/071,991

(22) Filed: Oct. 15, 2020

(65) Prior Publication Data

US 2022/0123693 A1    Apr. 21, 2022

(51) Int. Cl.
| | |
|---|---|
| H03F 1/07 | (2006.01) |
| H03F 1/02 | (2006.01) |
| H03F 3/24 | (2006.01) |
| H03F 1/56 | (2006.01) |
| H03F 3/195 | (2006.01) |

(52) U.S. Cl.
CPC .......... H03F 1/0288 (2013.01); H03F 1/565 (2013.01); H03F 3/195 (2013.01); H03F 3/245 (2013.01); *H03F 2200/451* (2013.01); *H03F 2200/555* (2013.01)

(58) Field of Classification Search
CPC ..................................... H03F 1/07; H03F 1/02

USPC .............................................. 330/124 R, 295
See application file for complete search history.

(56) References Cited

U.S. PATENT DOCUMENTS

| | | | |
|---|---|---|---|
| 8,410,848 B2 | 4/2013 | Bowles et al. | |
| 9,912,298 B2 * | 3/2018 | Lyalin | H03F 3/19 |
| 2018/0323756 A1 * | 11/2018 | Sun | H03F 3/45 |

FOREIGN PATENT DOCUMENTS

WO    20180197918 A1    11/2018

OTHER PUBLICATIONS

U.S. Appl. No. 16/718,679; 48 pages (filed Dec. 18, 2019).

* cited by examiner

*Primary Examiner* — Henry Choe

(57) ABSTRACT

Doherty power amplifiers and devices are described with a low voltage driver stage in a carrier-path and a high voltage driver stage in a peaking-path. In an embodiment a Doherty power amplifier has a carrier-path driver stage transistor configured to operate using a first bias voltage at the driver stage output, and a final stage transistor configured to operate using a second bias voltage at the final stage output. A peaking-path driver stage transistor is configured to operate using a third bias voltage at the driver stage output, and a final stage transistor electrically coupled to the driver stage output of the peaking-path driver stage transistor is configured to operate using a fourth bias voltage at the final stage output, wherein the third bias voltage is at least twice as large as the first bias voltage.

19 Claims, 9 Drawing Sheets

DOHERTY POWER AMPLIFIERS AND DEVICES WITH LOW VOLTAGE DRIVER STAGE IN CARRIER-PATH AND HIGH VOLTAGE DRIVER STAGE IN PEAKING-PATH

TECHNICAL FIELD

Embodiments of the subject matter described herein relate generally to radio frequency (RF) amplifiers, and more particularly to power transistor devices and amplifiers, and methods of manufacturing such devices and amplifiers.

BACKGROUND

An ever-growing demand in wireless communication systems is higher efficiency to reduce operational and system costs. In a wireless communication system transmitter, the radio frequency (RF) power amplifier is one of the most power consuming elements, and often the transmitter RF power amplifier has the highest impact on total power dissipated. Accordingly, amplifier and transmitter designers strive to develop RF power amplifiers with reduced power consumption and power loss, while maintaining or improving efficiency and RF bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
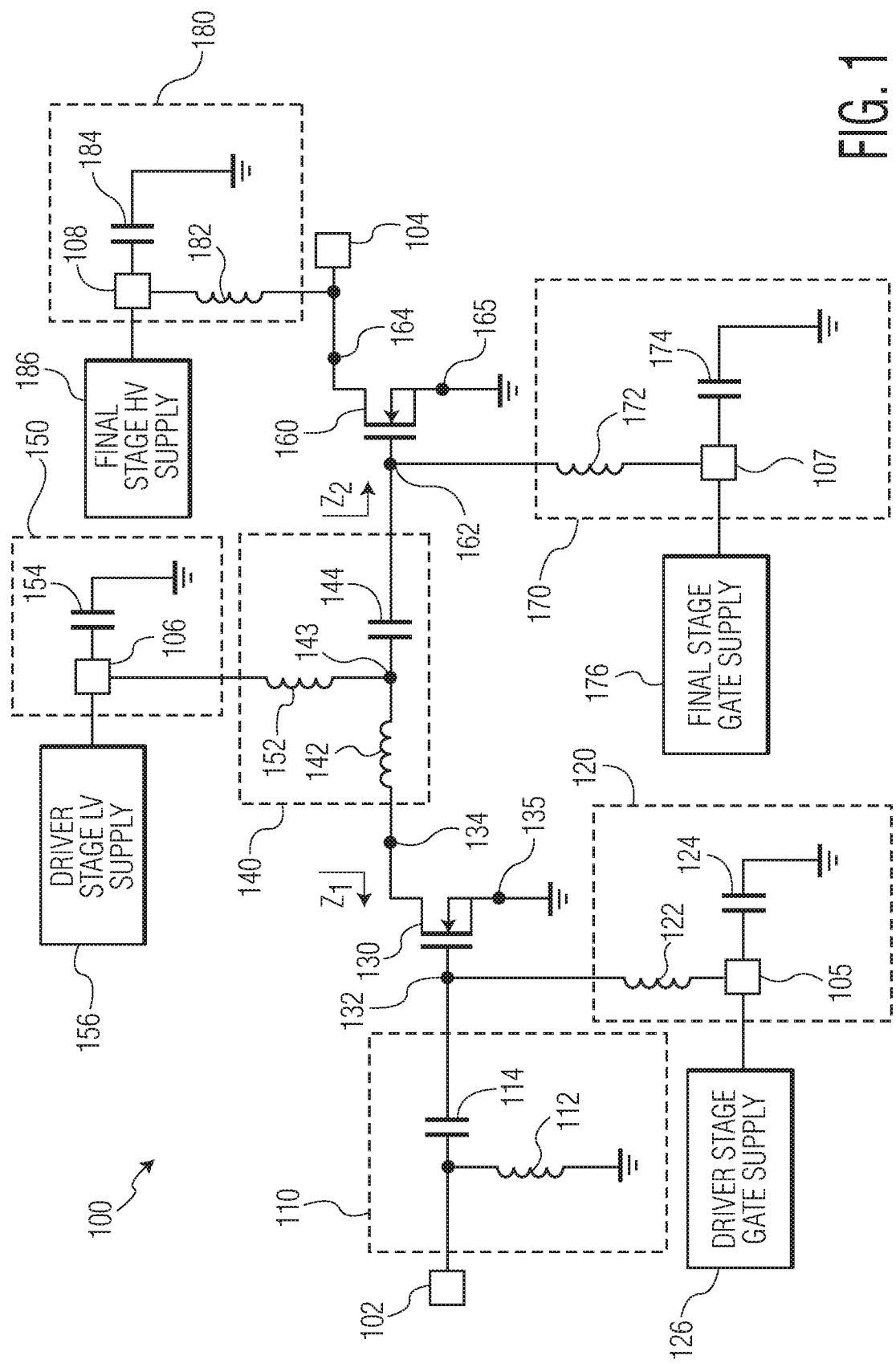
FIG. 1 is a schematic circuit diagram of a power amplifier circuit, in accordance with an example embodiment.

Doherty power amplifiers and devices are described with a low voltage driver stage in a carrier-path and a high voltage driver stage in a peaking-path. In an embodiment a Doherty power amplifier has a carrier-path driver stage transistor having a driver stage input and a driver stage output, wherein the carrier-path driver stage transistor is configured to operate using a first bias voltage at the driver stage output, a carrier-path final stage transistor having a final stage input and a final stage output, wherein the final stage input of the carrier-path final stage transistor is electrically coupled to the driver stage output of the carrier-path driver stage transistor, and the carrier-path final stage transistor is configured to operate using a second bias voltage at the final stage output, a peaking-path driver stage transistor having a driver stage input and a driver stage output, wherein the peaking-path driver stage transistor is configured to operate using a third bias voltage at the driver stage output, and a peaking-path final stage transistor having a final stage input and a final stage output, wherein the final stage input of the peaking-path final stage transistor is electrically coupled to the driver stage output of the peaking-path driver stage transistor, and the peaking-path final stage transistor is configured to operate using a fourth bias voltage at the final stage output, wherein the third bias voltage is at least twice as large as the first bias voltage.

In an embodiment, the first bias voltage is 5 volts.

In an embodiment, the second bias voltage and the fourth bias voltage are substantially equal to each other.

In an embodiment, the second bias voltage is at least twice as large as the first bias voltage.

In an embodiment, the first bias voltage is 5 volts.

In an embodiment, the second bias voltage, the third bias voltage, and the fourth bias voltage are substantially equal to each other.

In an embodiment, the first bias voltage is approximately 5 volts.

In an embodiment, the second bias voltage, the third bias voltage, and the fourth bias voltage are approximately 28 volts.

In an embodiment, the carrier-path driver stage transistor and the carrier-path final stage transistor are integrated into a semiconductor die, wherein the semiconductor die is a silicon-based die, the carrier-path driver stage transistor is a first laterally-diffused metal oxide semiconductor (LDMOS) field effect transistor (FET), and the carrier-path final stage transistor is a second LDMOS FET.

In an embodiment, the carrier-path driver stage transistor is integrated into a first semiconductor die, wherein the semiconductor die is a silicon-based die, the carrier-path driver stage transistor is a first laterally-diffused metal oxide semiconductor (LDMOS) field effect transistor (FET), and the carrier-path final stage transistor is integrated into a second semiconductor die, wherein the second semiconductor die is a III-V-based semiconductor die.

In an embodiment a method of operating a Doherty power amplifier that includes a carrier-path driver stage transistor and a carrier-path final stage transistor coupled in series and a peaking-path driver stage transistor and a peaking-path final stage transistor coupled in series, includes providing an output of the carrier-path driver stage transistor with a first bias voltage, providing an output of the carrier-path final stage transistor with a second bias voltage, providing an output of the peaking-path driver stage transistor with a third bias voltage, and providing an output of the peaking-path final stage transistor with a fourth bias voltage, wherein the third bias voltage is at least twice as large as the first bias voltage.

In an embodiment, the first bias voltage is less than 10 volts, and the third bias voltage is greater than 20 volts.

In an embodiment, the second bias voltage is greater than 20 volts, and the fourth bias voltage is greater than 20 volts.

In an embodiment, the first bias voltage is approximately 5 volts, and the third bias voltage is approximately 28 volts.

In an embodiment, the second bias voltage and the fourth bias voltage are substantially equal to each other.

In an embodiment, the second bias voltage is at least twice as large as the first bias voltage.

In an embodiment, the second bias voltage, the third bias voltage, and the fourth bias voltage are substantially equal to each other.

In an embodiment, the first bias voltage is 5V.

In an embodiment, a Doherty power amplifier includes a carrier-path driver stage transistor integrated in a first semiconductor die and having a driver stage input and a driver stage output, wherein the carrier-path driver stage transistor is configured to operate using a first bias voltage at the driver stage output, a carrier-path final stage transistor integrated in the first semiconductor die and having a final stage input and a final stage output, wherein the final stage input of the carrier-path final stage transistor is electrically coupled to the driver stage output of the carrier-path driver stage transistor, and the carrier-path final stage transistor is configured to operate using a second bias voltage at the final stage output, and the second bias voltage is at least twice as large as the first bias voltage, a peaking-path driver stage transistor integrated in a second semiconductor die and having a driver stage input and a driver stage output, wherein the peaking-path driver stage transistor is configured to operate using a third bias voltage at the driver stage output, and a peaking-path final stage transistor integrated in the second semiconductor die and having a final stage input and a final stage output, wherein the final stage input of the peaking-path final stage transistor is electrically coupled to the driver stage output of the peaking-path driver stage transistor, and the peaking-path final stage transistor is configured to operate using a fourth bias voltage at the final stage output, wherein the third bias voltage is at least twice as large as the first bias voltage.

In an embodiment, the first semiconductor die is a silicon-based die, the carrier-path driver stage transistor is a first laterally-diffused metal oxide semiconductor (LDMOS) field effect transistor (FET), and the carrier-path final stage transistor is a second LDMOS FET.

In an embodiment, the second bias voltage and the fourth bias voltage are substantially equal to each other.

A Doherty power amplifier may have two multi-stage paths. The input signal is divided into two equal parts and each part is conducted through a different multi-stage amplification path. The two amplified signal outputs are then combined to produce the final amplified result. As described herein, one of the paths is referred to as the carrier amplifier path or the main amplifier path. The other path is referred to as the peaking amplifier path. Each path has a driver stage amplifier as the first stage that provides an amplified signal to a final stage amplifier as the second stage. Each amplifier is embodied using a transistor so that there are four transistors together with all of the associated components to support the input, output, and amplification functions. While the present description refers primarily only to two stages and two paths, the present description may be applied to other modifications and variations of a Doherty power amplifier or of another multi-stage power amplifier.

Disclosed herein are embodiments of an RF power amplifier architecture, such as a Doherty power amplifier that includes a low voltage driver stage (e.g., 5 volts (V)) and a high voltage final stage (e.g., 28-32 V), for a carrier amplifier path, also referred to as a main amplifier path. "Low voltage driver stage" is used herein to refer to a power amplifier transistor that is configured to operate with and is supplied with a relatively low DC output bias voltage (e.g., the drain bias voltage), and "high voltage final stage" is used herein to refer to a power amplifier transistor that is configured to operate with and is supplied with a relatively high DC output bias voltage (e.g., the drain bias voltage). The described RF power amplifier architecture also includes a high voltage driver stage (e.g., 28-32 V) and a high voltage final stage (e.g., 28-32 V), for a peaking amplifier path.

Doherty power amplifiers are used as the final stage of a transmit chain line up, among other uses. For 5G ($5^{th}$ Generation) massive MIMO (Multiple Input Multiple Output) applications, a Doherty power amplifier component often consists of multiple stages housed inside a single package. To improve the system line-up efficiency, the gain of a Doherty power amplifier may be as important as its efficiency. In some Doherty power amplifier designs, if the design increases the gain of a Doherty power amplifier by XdB, the required output power from the pre-driver stage is lowered by XdB. This may reduce the pre-driver stage DC (Direct Current) power consumption significantly, leading to a higher line-up efficiency. As described herein, a Doherty power amplifier, having multiple stages may use a low-voltage driver stage for a carrier amplifier path, which may also be referred to as a main amplifier path, and a high-voltage driver stage for a peaking amplifier path. The Doherty power amplifier is particularly well suited for the fast growing and evolving 5G mMIMO market but has many other applications as well.

Compared with Doherty power amplifiers that bias the outputs of both the driver and final stages with the same relatively high voltage (e.g., a voltage of 28 V or more) or that bias the outputs of both the driver stages with the same relatively low voltage (e.g. a voltage of 5 V or less), the Doherty power amplifiers disclosed herein may have several potential advantages. One advantage may be compensating some of the gain that may otherwise be lost using a low voltage driver in the peaking amplifier path, as is done in some conventional systems, while capitalizing on the benefit of improved line up efficiency in the carrier amplifier path. Another advantage may be significant improvement in asymmetric Doherty power amplifier linearity by boosting peaking amplifier gain over the carrier amplifier gain. In this way, the Doherty power amplifier may overcome the low-gain disadvantage of low voltage carrier and peaking driver stages but may retain a high-efficiency advantage by using a low-voltage driver stage on only the carrier amplifier path. In a wireless communication system, the transmit and the RF power amplifiers are among the most power consuming elements in a transmitter. As a result, reducing the total dissipated power in the transmit and RF power amplifiers may have a large impact on reducing the system and operational cost. The disclosed Doherty power amplifiers may improve a Doherty power amplifier's gain as well as its linearized efficiency.

For example, given the relatively low output bias voltage in the carrier amplifier path, also referred to as the main amplifier path, the low voltage driver stage embodiments disclosed herein may be designed to have a significantly lower output impedance (e.g., $Z_1$, or the impedance looking into the drain of the driver stage transistor) than a high voltage driver stage, as is used in the peaking amplifier path, that has its output biased with a higher voltage (e.g., 28 V or more). For example, an embodiment of a low voltage driver stage may have an output impedance of less than 10 ohms, whereas a high voltage driver stage may have an output impedance of 60 ohms or more. The input impedance of the final stage (e.g., $Z_2$, or the impedance looking into the gate of the final stage transistor) in both the carrier and peaking amplifier path may be just a few ohms (e.g., 2-5 ohms or less). An interstage impedance matching network, in order to match the impedance between the carrier-path low voltage driver stage output and the carrier-path high voltage final stage input, may have a significantly reduced impedance transformation ratio (i.e., a ratio of the output impedance of the driver stage to the input impedance of the final stage), when compared with the impedance transformation ratio for the peaking amplifier path. For example, for the peaking amplifier path, a 28 V driver stage may require an impedance transformation ratio on the order of 30:1 to 50:1 (e.g., from about 60-100 ohms $Z_1$ to about 2 ohms $Z_2$), while the carrier amplifier path with a low voltage driver stage may only require an impedance transformation ratio of less than 10:1 (e.g., on the order of 2.5:1 to 5:1, corresponding to an impedance transformation ratio from about 5-10 ohms $Z_1$ to about 2 ohms $Z_2$).

As only a relatively low impedance transformation ratio is needed in the carrier amplifier path, an interstage impedance matching network in the carrier amplifier path may be relatively simple (e.g., fewer impedance matching stages and passive components). Accordingly, the interstage impedance matching network losses may be significantly reduced (e.g., by 3 decibels (dB) or more) during operation, when compared with the losses incurred in the interstage impedance matching network of the peaking amplifier path.

The efficiency of a Doherty power amplifier, when the Doherty power amplifier is operated at a power significantly backed off from the peak power, is predominantly determined by the carrier-path amplifier efficiency. With a carrier-path low-voltage driver stage in the carrier amplifier path, the impedance transformation ratio from the driver stage to the final stage is much lower which may reduce the interstage impedance matching network loss which reduces the output power required from the driver stage. As a result, the DC power consumption of the carrier-path driver stage may be significantly reduced, leading to a significant line-up efficiency improvement for the carrier amplifier path when the Doherty power amplifier is transmitting at reduced power. However, the line-up gain of the carrier amplifier path also may be reduced. For example, for a 5V-driver stage LDMOS (Laterally-Diffused Metal Oxide Semiconductor) carrier amplifier path, the output gain may drop by at least 3 dB compared to a 28V-driver stage LDMOS carrier amplifier path.

To increase the overall gain of the Doherty power amplifier, a high-voltage DC bias is applied to the driver stage of the peaking amplifier path. With a much higher line-up gain on the peaking side of the Doherty power amplifier, the system may overcome the potentially relatively low total system gain that may be inherent in amplifiers with low voltage driver stages on both paths. Increasing the power to the peaking-path driver stage as described herein may improve the Doherty gain by as much as 2 dB. In a conventional symmetric Doherty power amplifier, an input RF signal is split into two parts one for the carrier amplifier path and another for the peaking amplifier path by a power divider. The power divider provides equal power for the input signal to each of the two paths of the Doherty power amplifier. An asymmetric Doherty power amplifier has a larger peaking-path amplifier than it has a carrier-path amplifier and the power divider may split more power to the peaking amplifier path. In a similar way to the asymmetric Doherty power amplifier, when a low-voltage input driver stage is used for the peaking amplifier path, more input signal power may be sent to the driver stage of the peaking amplifier path by the power divider to compensate for the low DC bias of the driver stage. In some implementations, 3 dB (or more) higher power is applied from the power divider to the peaking-path driver stage. However, as the result, Doherty gain drops by about 2 dB when applying higher power to peaking path compared to equal split at input.

In each path, when the semiconductor technology for the driver and final stage transistors is the same, the driver and final stage transistors may be integrally formed on a single semiconductor substrate (e.g., in each path, both the driver and final stages may be silicon-based transistors integrated in a single silicon-based die), with the driver stage transistor for the carrier amplifier path customized for low voltage operation, and the driver stage transistor for the peaking amplifier path and both final stage transistors customized for high voltage operation. Separate dies may be used for the carrier and peaking paths, or a single die may include the driver and final stage transistors for the carrier and peaking paths. Accordingly, a more integrated line-up may be achieved, which makes for a cost-effective and high-throughput solution that is attractive and suitable for massive multiple-input/multiple-output (MIMO) applications. Nevertheless, any of the components and especially any high-power RF components may alternatively be integrated into a III-V-based semiconductor die (e.g., a gallium nitride (GaN) FET). Alternatively, the carrier-path driver stage transistor (and possibly the peaking-path driver stage transistor) may be integrated into a first semiconductor die, where the semiconductor die is a silicon-based die, and the carrier-path driver stage transistor is a first laterally-diffused metal oxide semiconductor (LDMOS) field effect transistor (FET). The carrier-path final stage transistor (and possibly the peaking-path final stage transistor) may be integrated into a second semiconductor die, in which the second semiconductor die is a III-V-based semiconductor die. This may optimize performance of each transistor.

Furthermore, embodiments of the invention may leverage the use of an available, low voltage power supply (e.g., a 5 V supply), which also may be used to power other RF subsystems of an RF transmitter or transceiver (e.g., a transmitter power amplifier pre-driver, a transmit/receive switch, a duplexer, and/or a receiver low noise amplifier). Therefore, the low voltage power supply may not present a unique requirement that would have otherwise added system cost.

Figure 2:
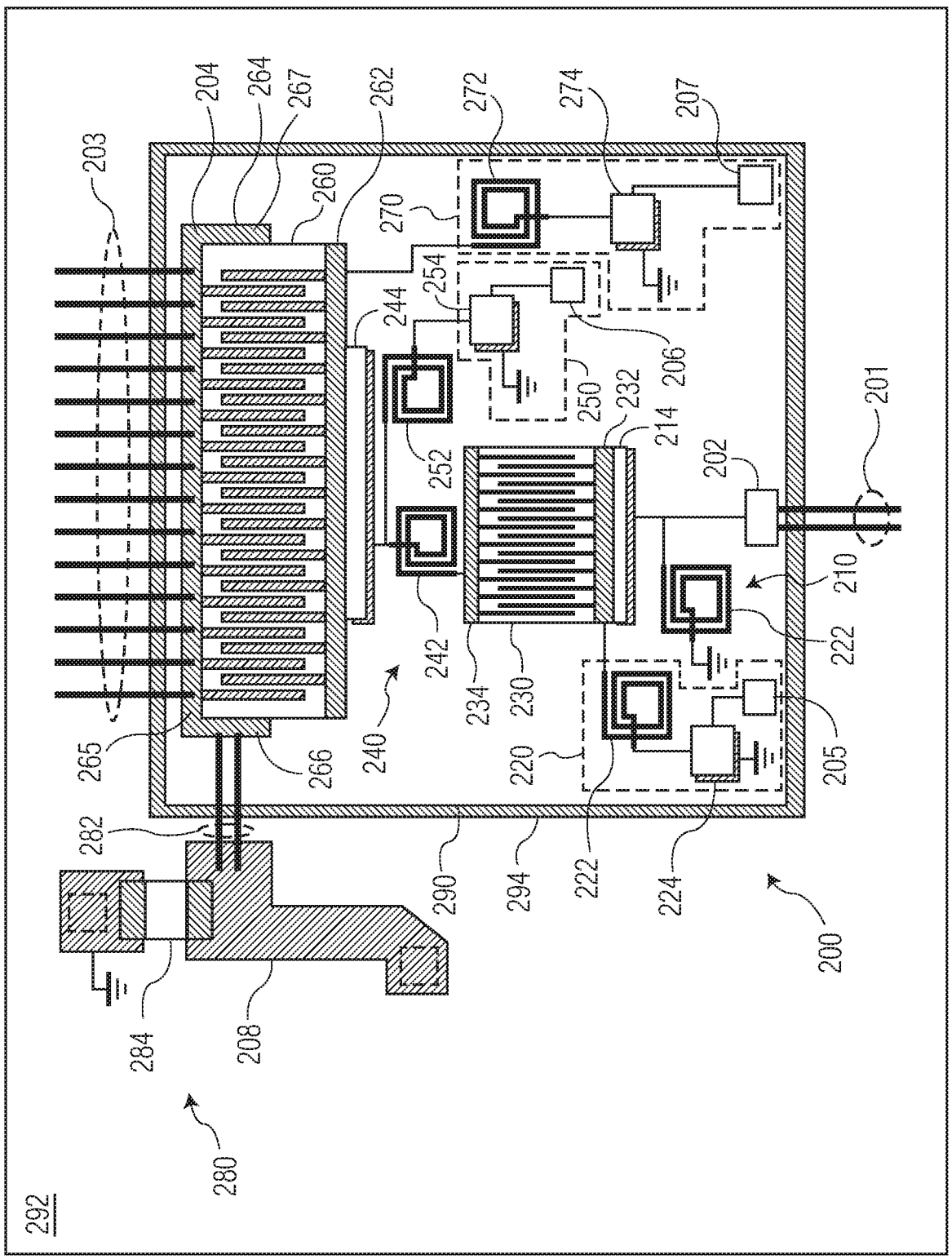
FIG. 2 is a top view of a two-stage power amplifier integrated circuit (IC), in accordance with an example embodiment.

FIG. 1 is a schematic circuit diagram of a power amplifier circuit 100 that includes a low voltage driver stage and a high voltage final stage, and FIG. 2 is a top view of a power amplifier integrated circuit (IC) 200 that embodies the power amplifier circuit 100 of FIG. 1, in accordance with various example two-stage power amplifier embodiments. For clarity and brevity, FIGS. 1 and 2 will be described together, below.

As best illustrated in FIG. 2, many of the components of the power amplifier IC 200 that correspond to components of the power amplifier circuit 100 may be coupled to or integrally-formed with a semiconductor die 290, as a single die which is mounted to a mounting surface of a host substrate 292. For example, as will be described in more detail in conjunction with FIG. 6, the host substrate 292 may be a small printed circuit board (PCB), although the host substrate 292 alternatively may be a conductive package flange or other suitable substrate. As will also be described in more detail in conjunction with FIG. 6, the host substrate 292 may include an embedded, electrically and thermally conductive coin 294 or thermal vias, configured to provide a ground reference voltage and to function as a heat sink, and the semiconductor die 290 may be mounted to the thermally conductive coin 294 or thermal vias.

The power amplifier circuit 100 and the power amplifier IC 200 are suitable for amplifying RF signals and each include an RF input 102, 202, an input stage impedance matching network 110, 210, a driver stage transistor 130, 230, an interstage impedance matching network 140, 240, a final stage transistor 160, 260, first and second input DC bias circuits 120, 170, 220, 270, first and second output DC bias circuits 150, 180, 250, 280, and an RF output 104, 204, in an embodiment. In the embodiment of FIG. 2, the second output (drain) bias circuit 280 actually may be implemented off chip (i.e., the second output (drain) bias circuit 280 is electrically coupled to, but not integrally formed with the power amplifier IC 200). In an alternate embodiment, the second output (drain) bias circuit 280 may be implemented on-chip, similar to the implementations of the DC bias circuits 220, 250, and 270.

The RF input 102, 202 and the RF output 104, 204 each may include a conductor, which is configured to enable the power amplifier circuit 100 and the power amplifier IC 200 to be electrically coupled with external circuitry (not shown). For example, as depicted in FIG. 2, the RF input 202 includes a conductive bondpad, which is exposed at the top surface of the semiconductor die 290, and which is configured for attachment of a set of one or more wirebonds 201 (e.g., the wirebond array as described with reference to FIG. 2). The RF output 204 is electrically coupled to (or is a same conductive structure as) an output/drain terminal 264 of the final stage transistor 260, which also may be a conductive bondpad that is exposed at the top surface of the semiconductor die 290. The first set of wirebonds 201 is configured to convey an input RF signal from external circuitry (e.g., the pre-amplifier device 730 as described with reference to FIG. 7) to the RF input 202, and the second set of wirebonds, such as wirebond array 203 is configured to convey an output RF signal from the RF output 204 to external circuitry (e.g., the duplexer 760 as described with reference to FIG. 7).

The input stage impedance matching network 110, 210 is electrically coupled between the RF input 102, 202 and an input/gate terminal 132, 232 of the driver stage transistor 130, 230. Further, the interstage impedance matching network 140, 240 is electrically coupled between an output/drain terminal 134, 234 of the driver stage transistor 130, 230 and an input/gate terminal 162, 262 of the final stage transistor 160, 260. An output/drain terminal 164, 264 of the final stage transistor 160, 260 is electrically coupled to (or is a same conductive structure as) the RF output 104, 204.

Each transistor 130, 160, 230, 260 is characterized by input and output impedances, such as the output impedance of the driver stage transistor 130, 230 ($Z_1$) and the input impedance of the final stage transistor 160, 260 ($Z_2$). The input stage and interstage impedance matching networks 110, 140, 210, 240 each are configured to perform a desired impedance transformation to, from, or between the input and output impedances of the transistors 130, 160, 230, 260.

For example, the input stage impedance matching network 110, 210 is configured to raise the impedance of the power amplifier circuit 100 or the power amplifier IC 200 to a higher (e.g., an intermediate or higher) impedance level (e.g., in a range from about 2 to about 50 Ohms or higher). According to an embodiment, the input stage impedance matching network 110, 210 includes a shunt inductive element 112, 212 and a series capacitance 114, 214. The shunt inductive element 112, 212 has a first terminal electrically coupled to the RF input 102, 202, and a second terminal electrically coupled to a ground reference node (e.g., to a conductive layer that is a conductive backside contact 380 as described with reference to FIGS. 3, 4, with through-substrate vias (TSVs) or through-doped sinker regions). The series capacitance 114, 214 has a first terminal (or electrode) electrically coupled to the RF input 102, 202, and a second terminal (or electrode) electrically coupled to the input/gate terminal 132, 232 of the driver stage transistor 130, 230. According to an embodiment, the shunt inductive elements 112, 212 may have an inductance value in a range between about 0.1 nanohenries (nH) to about 10 nH, and the series capacitance 114, 214 may have a capacitance value in a range between about 0.1 picofarads (pF) to about 30 pF, although each of these components may have component values lower or higher than the above-given ranges, as well.

The interstage impedance matching network 140, 240 is configured to match the output impedance ($Z_1$) of the driver stage transistor 130, 230 to the input impedance ($Z_2$) of the final stage transistor 160, 260. According to an embodiment, the interstage impedance matching network 140, 240 includes a series inductive element 142, 242, a series capacitance 144, 244, and a shunt inductive element 152, 252. The series inductive element 142, 242 and the series capacitance 144, 244 are coupled in series with each other between the output/drain terminal 134, 234 of the driver stage transistor 130, 230 and the input/gate terminal 162, 262 of the final stage transistor 160, 260, with an intermediate node 143 between the two series-coupled components. More particularly, the series inductive element 142, 242 has a first terminal electrically coupled to the output/drain terminal 134, 234 of the driver stage transistor 130, 230, and a second terminal electrically coupled to the intermediate node 143. The series capacitance 144, 244 has a first terminal (or electrode) electrically coupled to the intermediate node 143, and a second terminal (or electrode) electrically coupled to the input/gate terminal 162, 262 of the final stage transistor 160, 260. The shunt inductive element 152, 252 has a first terminal electrically coupled to the intermediate node 143, and a second terminal electrically coupled to a ground reference node (e.g., through a capacitor 154, 254). According to an embodiment, the series inductive element 142, 242 may have an inductance value in a range between about 0.1 nH to about 10 nH. The series capacitance 144, 244 may have a capacitance value in a range between about 0.1 pF to about 30 pF, and the shunt inductive element 152, 252 may have an inductance value in a range between about 0.1 nH to about 10 nH, although each of these components may have component values lower or higher than the above-given ranges, as well.

As illustrated in FIG. 2, the inductive elements 112, 142, 152, 212, 242, 252 and the capacitances 114, 144, 214, 244 may be integrally formed in the semiconductor die 290. For example, the inductive elements 112, 142, 152, 212, 242, 252 may be implemented as spiral inductors that are formed from patterned conductive portions of the build-up layers of the semiconductor die 290 (e.g., the build-up layers 304 as described with reference to FIGS. 3, 4), and capacitances 114, 144, 214, 244 may be implemented as metal-insulator-metal (MIM) capacitors that are formed in the build-up layers of the semiconductor die 290. In alternate embodiments, some or all of the inductive elements 112, 142, 152, 212, 242, 252 and capacitances 114, 144, 214, 244 may be implemented as surface-mount, "chip" components, which are physically coupled to the top surface of the semiconductor die 290, and electrically coupled through bondpads or other contacts (not shown) exposed at the top surface of the semiconductor die 290. Further, in other alternate embodiments, some or all of the inductive elements 112, 142, 152, 212, 242, 252 may be implemented as wirebonds.

The driver stage and final stage transistors 130, 160, 230, 260 are active components of the power amplifier circuit 100 and the power amplifier IC 200. Each of the transistors 130, 160, 230, 260 is configured to amplify an RF signal conducted through the transistors 130, 160, 230, 260. As used herein, the term "transistor" means a field effect transistor (FET) or another type of suitable transistor. For example, a "FET" may be a metal-oxide-semiconductor FET (MOSFET), a laterally-diffused MOSFET (LDMOS FET), an enhancement-mode or depletion-mode high electron mobility transistor (HEMT), or another type of FET. The description herein refers to each transistor as including an input terminal (or control terminal) and two current-conducting terminals. For example, using terminology associated with FETs, an "input terminal" refers to a gate terminal of a transistor, and first and second current-conducting terminals refer to drain and source terminals (or vice versa) of a transistor.

The driver stage transistor 130, 230 includes an input/gate terminal 132 (e.g., an input/gate terminal 232), a first current conducting terminal, such as the output/drain terminal 134 (e.g., an "output" or drain terminal 234), and a second current conducting terminal, such as the source terminal 135 (e.g., a source terminal, not shown in FIG. 2). Similarly, the final stage transistor 160, 260 includes an input/gate terminal 162 (e.g., a gate terminal 262), an output/drain terminal 164 (e.g., a first current conducting terminal 264), and a source terminal 165 (e.g., a second current conducting terminal, not shown in FIG. 2).

In a specific embodiment, each transistor 130, 160, 230, 260 includes an active area disposed between its input/gate terminals 132, 162, 232, 262 and its output/drain terminals 134, 164, 234, 264. As described with reference to FIGS. 2-4, the active areas of the transistors 230, 260 each include a plurality of elongated, parallel-aligned, and interdigitated drain regions (e.g., the multiple, parallel-aligned instances of the interdigitated drain region 340, 440 as described with reference to FIGS. 3, 4) and the source regions (e.g., the multiple, parallel-aligned instances of the source region 330, 430 as described with reference to FIGS. 3, 4), where each drain region and each source region is a doped semiconductor region formed in a base semiconductor substrate (e.g., the base semiconductor substrate 302 as described with reference to FIG. 3).

Figure 3:
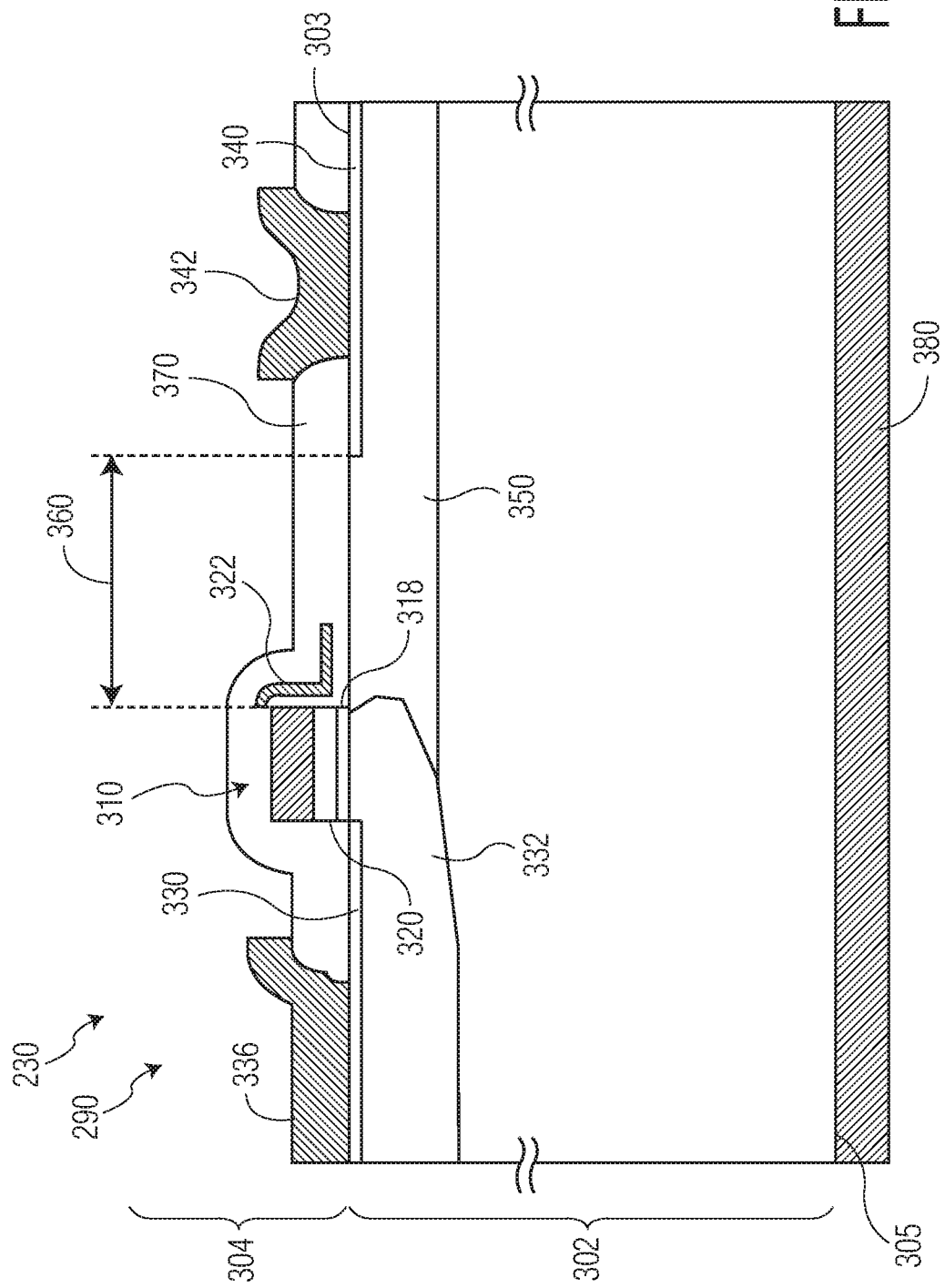
FIG. 3 is a cross-sectional, side view of a portion of the driver stage transistor of FIG. 2, in accordance with an embodiment.
Figure 4:
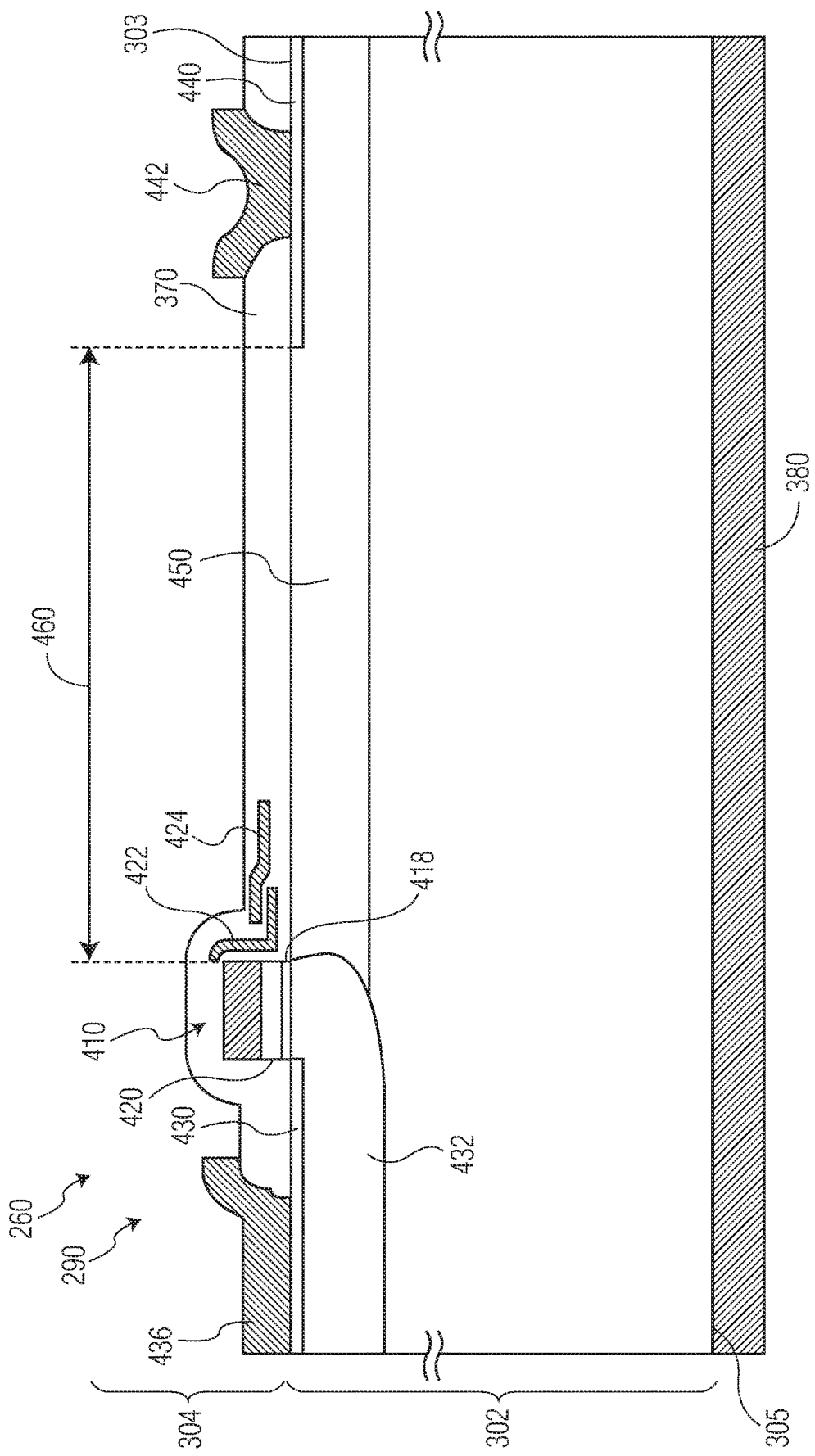
FIG. 4 is a cross-sectional, side view of a portion of the final stage transistor of FIG. 2 in accordance with an embodiment.

A variably-conductive channel region and a drain drift region (e.g., the drift regions 350, 450 as described with reference to FIGS. 3, 4) are present between adjacent source regions and drain regions. Conductive (e.g., polysilicon or metal) gate structures (e.g., the gate structures 310, 410 as described with reference to FIGS. 3, 4) extend over and along the elongated channel regions. The gate structures of the driver stage transistor 230 are electrically coupled together with a first gate manifold, and the gate structures of transistor 260 are electrically coupled together with a second gate manifold. Each of the gate manifolds of transistors 230, 260 are closely electrically coupled to their respective input/gate terminals 232, 262. Similarly, the drain regions of the driver stage transistor 230 are electrically coupled together with the first drain manifold, and the drain regions of the final stage transistor 260 are electrically coupled together with the second drain manifold. Each of the drain manifolds of the transistors 230, 260 are closely electrically coupled to their respective output/drain terminals 234, 264. Due to their elongated shapes, each set of adjacent drain and source regions, along with a gate structure (e.g., the gate structures 310, 410 as described with reference to FIGS. 3, 4) overlying a channel region between the adjacent drain and source regions, may be referred to as a "transistor finger." Each transistor 130, 160, 230, 260 includes a plurality of parallel transistor fingers within the active area of the transistor.

In various embodiments, the power amplifier circuit 100 and the power amplifier IC 200 each include DC bias circuits 120, 150, 170, 180, 220, 250, 270, 280, which are configured to provide DC bias voltages to the input/gate terminals 132, 162, 232, 262 and to the output/drain terminals 134, 164, 234, 264 of the transistors 130, 160, 230, 260. Each of the input DC bias circuits 120, 170, 220, 270 is configured as a "shunt inductance" (or shunt-L) circuit, which includes an inductive element 122, 172, 222, 272 and a capacitor 124, 174, 224, 274 connected in series between a transistor input/gate terminal 132, 162, 232, 262 and a ground reference voltage, with an intermediate node and contact 105, 107, 205, 207 between each inductor/capacitor pair. Similarly, each of the output DC bias circuits 150, 180, 250, 280 is configured as a "shunt inductance" (or shunt-L) circuit, which includes an inductive element 152, 182, 242, 252 and a capacitor 154, 184, 254, 284 connected in series between an output/drain terminal 134, 164, 234, 264 of a transistor and a ground reference voltage, with an intermediate node and contact 106, 108, 206, 208 between each inductor/capacitor pair. According to an embodiment, node and contacts 205, 206, 207 (corresponding to nodes and contacts 105-107) are implemented as conductive bondpads, which are exposed at the top surface of the semiconductor die 290, and which are configured for attachment of one or more wirebonds. The node and contact 208 (corresponding to node 108) is implemented as a portion of a patterned conductive layer on the top surface of the host substrate 292. The node and contact 208 is configured for attachment of one or more wirebonds (e.g., the wirebond array 282 as described with reference to FIG. 2).

According to an embodiment, the inductive elements 222, 252, 272 and capacitors 224, 254, 274 are integrally formed in the semiconductor die 290. For example, each of the inductive elements 222, 252, 272 may be implemented as a spiral inductor that is formed from patterned conductive portions of the build-up layers of the semiconductor die 290 (e.g., the build-up layers 304 as described with reference to FIGS. 3, 4), and each of capacitors 224, 254, 274 may be implemented as a metal-insulator-metal (MIM) capacitor that is formed in the build-up layers of the semiconductor die 290. In alternate embodiments, some or all of the inductive elements 222, 252, 272 and capacitors 224, 254, 274 may be implemented as surface-mount, "chip" components, which are physically coupled to the top surface of the semiconductor die 290 or to the host substrate 292, and electrically coupled through bondpads or other contacts (not shown) exposed at the top surface of the semiconductor die 290 or the host substrate 292. Further, in other alternate embodiments, some or all of the inductive elements 222, 252, 272 may be implemented as wirebonds. For example, in the embodiment of FIG. 2, the wirebond array 282 implements an inductive element as a set of wirebonds that are electrically coupled between the output/drain terminal 264 of final stage transistor 260 and node and contact 208, and capacitor 284 is implemented as a chip capacitor that is coupled to the top surface of the host substrate 292.

As illustrated in FIG. 2, the output/drain terminal 264 is configured to enable multiple wirebond arrays 203, 282 to be coupled to the output/drain terminal 264 with angularly offset (e.g., perpendicular) orientations. More specifically, the output/drain terminal 264 has an elongated first conductive bondpad 265 to which the wirebond array 203 is connected, and an elongated second conductive sidepad 266 (or "bondpad") to which another wirebond array 282 is connected. For reasons that will be apparent in the discussion of FIG. 6, the output/drain terminal 264 also may include an elongated third conductive sidepad 267 (or "bondpad") to which another wirebond array may be connected. In any event, the second and third conductive sidepads 266, 267 may be coupled or connected to opposite ends of the elongated first conductive bondpad 265. The second and third conductive sidepads 266, 267 may have their longest dimensions oriented perpendicularly to the longest dimension of the first conductive bondpad, in an embodiment.

According to an embodiment, each of the capacitors 124, 154, 174, 184, 224, 254, 274, 284 has a sufficiently high capacitance value (e.g., greater than about 60 pF) to ensure that each node and contact 105, 106, 107, 108, 205, 206, 207, 208 corresponds to an RF low-impedance point (e.g., an "RF cold point" or a "pseudo-RF cold point"). In other words, each node and contact 105, 106, 107, 108, 205, 206, 207, 208 represents a low impedance point in the circuit for RF signals. This ensures that minimal RF signal energy is lost through the DC bias circuits 120, 150, 170, 180, 220, 250, 270, 280.

To provide bias voltages to the input/gate terminals 132, 162, 232, 262 and output/drain terminals 134, 164, 234, 264 of the transistors 130, 160, 230, 260, an external gate or drain DC bias voltage supply 126, 156, 176, 186 (not shown in FIG. 2) is connected to each node and contact 105, 106, 107, 108, 205, 206, 207, 208. More specifically, a driver stage gate supply 126 is connected to node and contact 105, 205 to provide a DC bias voltage to the input/gate terminal 132, 232 of the driver stage transistor 130, 230. A driver stage LV (Low Voltage) drain supply 156 is connected to node and contact 106, 206 to provide a DC bias voltage to the output/drain terminal 134, 234 of the driver stage transistor 130, 230. A final stage gate supply 176 is connected to node and contact 107, 207 to provide a DC bias voltage to the input/gate terminal 162, 262 of the final stage transistor 160, 260, and a final stage HV drain supply 186 is connected to the node and contact 108, 208 to provide a DC bias voltage to the output/drain terminal 164, 264 of the final stage transistor 160, 260. The driver stage and final stage gate supplies 126, 176 each may provide a DC gate bias voltage in a range of about 0.5 V to about 3.5 V, although the DC gate bias voltages may be lower or higher, as well.

According to an embodiment, the driver stage and final stage drain supplies 156, 186 provide substantially different DC drain bias voltages to the transistors 130, 230 and 160, 260, respectively. More particularly, the driver stage LV drain supply 156 provides a significantly lower DC drain bias voltage to the node and contact 106, 206 (and thus to the output/drain terminal 134, 164 of the driver stage transistor 130, 230) than the DC drain bias voltage that is provided by the final stage HV drain supply 186 to node and contact 108, 208 (and thus to the output/drain terminal 164, 264 of the final stage transistor 160, 260). Accordingly, the driver stage LV drain supply 156 may be referred to as a driver stage low voltage (LV) supply, and the driver stage transistor 130, 230 may be referred to as a low voltage driver stage, whereas the final stage HV drain supply 186 may be referred to as a final stage high voltage (HV) supply, and the final stage transistor 160, 260 may be referred to as a high voltage final stage.

In a particular embodiment, the driver stage LV drain supply 156 provides a DC bias voltage of less than about 10 V, and in a more particular embodiment, the driver stage LV drain supply 156 provides a DC bias voltage of about 5 V.

As will be described in more detail in conjunction with FIG. 7, the driver stage LV drain supply 156 preferably supplies a DC bias voltage that can also be utilized by other circuitry in an RF system (e.g., by a pre-amplifier device 730, duplexer 760, and/or low noise amplifier (LNA) device 750 of a transmitter or transceiver module 700 as described with reference to FIG. 7). For example, the driver stage LV drain supply 156 may be a commercial, off-the-shelf (or standard) power supply, although the driver stage LV drain supply 156 may be a custom power supply, as well. In a particular embodiment, the final stage HV drain supply 186 provides a DC bias voltage of at least twice as large as the DC bias voltage of the driver stage LV drain supply 156. For example, the final stage HV drain supply 186 may provide a DC bias voltage greater than about 20 V (e.g., in a range of 28-32 V or higher). In various embodiments, the ratio of the DC bias voltage provided by the final stage HV drain supply 186 to the DC bias voltage provided by driver stage LV drain supply 156 is greater than 2 (e.g., in a range between 2 and 10). In a more specific embodiment, the ratio is between about 5.6 and about 6.4 when the DC bias voltage provided by the final HV stage drain supply 186 is about 28-32 V, and the DC bias voltage provided by driver stage LV drain supply 156 is about 5 V.

According to an embodiment of the carrier amplifier path as shown, the driver stage transistor 130, 230 and the final stage transistor 160, 260 are configured differently from each other in order to operate efficiently with the relatively low and relatively high DC drain bias voltages, respectively. The driver stage transistor 130, 230 is configured to have a significantly lower power density and a significantly lower drain-source "on" resistance ($R_{DS(on)}$) (i.e., the total resistance between the output/drain terminal 134 and the second current conducting source terminal 135 when the driver stage transistor 130, 230 is fully on) than the final stage transistor 160, 260. For example, the driver stage transistor 130, 230 may have a power density in a range of about 0.1 watts per millimeter (W/mm) to about 0.2 W/mm, whereas the final stage transistor 160, 260 may have a power density in a range of about 0.9 W/mm to about 1.3 W/mm (e.g., the power density of the final stage transistor 160, 260 is at least 200 percent greater than (i.e., 3 times) the power density of the driver stage transistor 130, 230, and potentially up to or greater than 10 times the power density of the driver stage transistor 130, 230). Further, the driver stage transistor 130, 230 may have an $R_{DS(on)}$ in a range of about 5 ohm-mm to about 10 ohm-mm, whereas the final stage transistor 160, 260 may have an $R_{DS(on)}$ in a range of about 10 ohm-mm to about 15 ohm-mm (e.g., the $R_{DS(on)}$ of the final stage transistor 160, 260 is greater than, and in some cases up to three times greater than the $R_{DS(on)}$ of the driver stage transistor 130, 230).

Because the driver stage transistor 130, 230 is configured to operate with a relatively low DC drain bias voltage, the driver stage transistor 130, 230 may be performance optimized (e.g. lower on resistance ($R_{DS(on)}$)). To accomplish this optimization, the driver stage transistor 130, 230 may be designed to have a significantly lower breakdown voltage than the final stage transistor 160, 260. Although the difference in breakdown voltages may be accomplished in a number of ways, according to a particular embodiment, the difference may be achieved by configuring the driver stage transistor 130, 230 with a significantly shorter drift region between the gate and the drain within each transistor finger. To illustrate, FIGS. 3 and 4 depict cross-sectional, side views of portions of the driver stage transistor 230 and the final stage transistor 260 of FIG. 2, in accordance with an embodiment. More specifically, each of FIGS. 3 and 4 depict a cross-sectional, side view through a single transistor finger within the driver stage transistor 230 (FIG. 3) and the final stage transistor 260 (FIG. 4), respectively.

Both the driver stage transistor 230 (FIG. 3) and the final stage transistor 260 (FIG. 4) are integrally formed with the semiconductor die 290, although they may be formed in separate dies, in other embodiments. More specifically, the semiconductor die 290 includes a base semiconductor substrate 302, and a plurality of build-up layers 304 over a top surface 303 of the base semiconductor substrate 302 (only a lower portion of the build-up layers 304 are shown in FIGS. 3 and 4 to avoid unnecessary detail). In a particular example embodiment, the base semiconductor substrate 302 is a high-resistivity silicon substrate (e.g., a silicon substrate having bulk resistivity in a range of about 1000 ohm/centimeter (cm) to about 100,000 ohm/cm or greater). Alternatively, the base semiconductor substrate may be a semi-insulating gallium arsenide (GaAs) substrate (e.g., a GaAs substrate having bulk resistivity up to $10^8$ ohm/cm), or another suitable high-resistivity substrate. In still other alternate embodiments, the base semiconductor substrate may be any of multiple variants of a gallium nitride (GaN) substrate, a silicon carbide (SiC) substrate (e.g., to accommodate, for example, GaN epitaxial layers grown on SiC), or other III-V semiconductor substrates. An advantage to the use of a high-resistivity substrate is that such a substrate may enable various on-die circuitry to exhibit relatively low losses, when compared with amplifier dies that do not utilize a high-resistivity substrate. In other embodiments, however, a lower resistivity (or more conductive) substrate may be used.

In an embodiment in which the base semiconductor substrate 302 is a high-resistivity substrate, conductive paths may be made between the top surface 303 of the base semiconductor substrate 302 and a conductive backside contact 380 on the bottom surface of the substrate 305 using through-substrate vias (TSVs, not shown). Alternatively, for lower resistivity (or more conductive) substrates, conductive paths between the top surface 303 and the conductive backside contact 380 may be made, at least in part, using low resistivity sinker regions. In any event, the conductive backside contact 380 may be connected to a ground (e.g., to the thermally conductive coin 294 or thermal vias as described with reference to FIG. 2), when the semiconductor die 290 is integrated into a larger electrical system, and the TSVs (or sinker regions) may be used to electrically connect the source regions 330, 430 and other components (e.g., the inductor 212 and capacitors 224, 254, 274 as described with reference to FIG. 2) to ground.

Each transistor 230, 260 includes a gate structure 310, 410 supported by a top surface 303 of the base semiconductor substrate 302, along with source regions 330, 430 that are doped and drain regions 340, 440 (or more generally "current-carrying regions") extending from the top surface 303 into the base semiconductor substrate 302 on either side of the gate structure 310, 410. Each source region 330, 430 and drain region 340, 440, or portions thereof, may have a dopant concentration at a level sufficient to establish ohmic contacts with electrodes or interconnects 336, 436 and 342, 442.

According to an embodiment, each source region 330, 430 may be disposed along or aligned with a first sidewall 320, 420 of the gate structure 310, 410. Furthermore, each drain region 340, 440 may be laterally separated across the top surface 303 of the base semiconductor substrate 302 from a second, opposite sidewall 318, 418 of the gate structure 310, 410, and a drift region 350, 450 extends laterally from each drain region 340, 440 to each gate structure 310, 410.

Each transistor 230, 260 also includes a well or diffused region 332, 432 in the base semiconductor substrate 302 under the gate structure 310, 410. During operation, a channel or channel region is formed in the well or diffused region 332, 432 at a top surface 303 of the base semiconductor substrate 302 via application of a DC bias voltage (e.g., supplied by the driver stage LV drain supply 156 or the final stage HV drain supply 186 as described with reference to FIG. 1) to a conductive portion of the gate structure 310, 410. As discussed previously, during operation, the drain region 340 of the driver stage transistor 230 is biased at a significantly lower bias voltage than the bias voltage applied to the drain region 440 of the final stage transistor 260.

The semiconductor die 290 may include one or more passivation layers 370 covering the top surface 303. One or more shield plate(s) 322, 422, 424 may be disposed between adjacent dielectric or passivation layers 370. As indicated in FIGS. 3 and 4, the configuration of the shield plates 322, 422, 424 may be different for the driver stage transistor 230 (which includes only a single shield plate 322) and the final stage transistor 260 (which includes two shield plates 422, 424). In any event, the shield plate(s) 322, 422, 424 may help protect the gate dielectric from damage or degradation arising from charge carriers accelerated under the electric field arising from the drain-source voltage (i.e., "hot carriers"). The shield plate(s) 322, 422, 424 may also help to reduce the maximum electric field in the drift region 350, 450. The shield plate(s) 322, 422, 424 may be grounded or otherwise biased to deter injection of such hot carriers into the oxide or other dielectric material under the gate structure 310, 410 and/or the oxide or other dielectric material over the drift region 350, 450.

According to an embodiment, the length 360 of the drift region 350 in driver stage transistor 230 (i.e., the dimension from the second opposite sidewall 318 of the gate structure 310 to the drain region 340) is significantly shorter than the length 460 of the drift region 450 in the final stage transistor 260 (i.e., the dimension from the second opposite sidewall 418 of the gate structure 410 to the drain region 440), which results in a significantly lower $R_{DS(on)}$ and breakdown voltage for the driver stage transistor 230, in comparison with the $R_{DS(on)}$ and breakdown voltage of the final stage transistor 260. In some embodiments, for example, the length 360 of the drift region 350 in the driver stage transistor 230 may be in a range of about 0.5 microns to about 1.5 microns (e.g., about 1.0 microns), whereas the length 460 of the drift region 450 in the final stage transistor 260 may be in a range of about 2.0 microns to about 3.5 microns (e.g., about 2.8 microns). In other words, the length 460 of the drift region 450 in the final stage transistor 260 is at least 50 percent larger than the length 360 of the drift region 350 in the driver stage transistor 230 (e.g., in a first range from about 50 percent to about 600 percent larger, or in a second range from about 100 percent to about 200 percent larger). The lengths 360, 460 may be smaller or larger than the above-given ranges, as well. Essentially, establishing a significantly shorter length 360 for the drift region 350 in the driver stage transistor 230 in comparison to the length 460 of the drift region 450 in the final stage transistor 260 causes the driver stage transistor 230 to have a significantly lower (e.g., at least about 40-50 percent lower) $R_{DS(on)}$ than the $R_{DS(on)}$ of the final stage transistor 260, and causes the driver stage transistor 230 to have a significantly lower (e.g., at least about 50-60 percent lower) breakdown voltage than the breakdown voltage of the final stage transistor 260. Said another way, the breakdown voltage of the final stage transistor 260 may be significantly higher (e.g., at least about 100-150 percent higher) than the breakdown voltage of the driver stage transistor 230. For example, the breakdown voltage of the driver stage transistor 230 may be in a range of about 25 V to about 40 V (e.g., about 32 V), and the breakdown voltage of the final stage transistor 260 may be in a range of about 65 V to about 80 V (e.g., about 71 V).

In addition to having a lower $R_{DS(on)}$, the lower power density of the driver stage transistor 130, 230 enables the driver stage transistor 230 to be designed with more transistor fingers, per unit width (horizontal dimension as described with reference to FIG. 2), than the final stage transistor 260. By providing more transistor fingers per unit width in the driver stage transistor 230, the $R_{DS(on)}$ of the driver stage transistor 230 may be reduced even further, with respect to the $R_{DS(on)}$ of the final stage transistor 260 without consuming significant additional die area. In an embodiment, the reduced $R_{DS(on)}$ of the driver stage transistor 230 allows the frequency response and efficiency of the driver stage transistor 230 to be optimized for the lower voltage operation of the driver stage transistor 230.

Although, in the above-described embodiment, breakdown voltage and $R_{DS(on)}$ differences are achieved, at least in part, by implementing a drift region 350 with a shorter length 360 in the driver stage transistor 230 than the length 460 of the drift region 450 that is implemented in the final stage transistor 260, the breakdown voltage and $R_{DS(on)}$ differences may be accomplished in other ways, as well. For example, breakdown voltage and $R_{DS(on)}$ differences may be achieved, as well, by using various combinations of different doping levels, different drift region widths (dimension into the page in FIGS. 3, 4), different drift region depths (vertical dimension in FIGS. 3, 4), different drift region lengths, and/or by configuring other characteristics of the driver stage transistor 230 and the final stage transistor 260 differently. In other words, drift regions 350, 450 have one or more different characteristics selected from different doping levels, different drift region widths, different drift region depths, and different drift region lengths.

The shorter drift region 350 and the other selected different characteristics are particularly well suited for a low voltage driver stage transistor as is used in the carrier path amplifier at least because the carrier-path driver stage transistor is configured to operate at a lower bias voltage. On the other hand, the peaking path driver stage transistor is operated with a higher bias voltage. Accordingly, the drift region of the peaking path driver stage transistor may resemble more the longer drift region 450 of a final stage transistor.

Referring again to FIGS. 1 and 2, and given the characteristics of the driver and final stage transistors 130, 160, 230, 260 described above and the relatively low output bias voltage provided to the driver stage transistor 130, 230, the driver stage transistor 130, 230 with a low drain voltage supply may have a significantly lower output impedance (e.g., $Z_1$, or the impedance looking into the drain of the driver stage transistor 130, 230) than a high voltage driver transistor (e.g., in a system in which the driver transistor has its output biased with a higher voltage, such as 28 V or more). For example, an embodiment of the driver stage transistor 130, 230 with a low drain voltage supply may have an output impedance of less than 10 ohms (e.g., from 5-10 ohms), whereas a high voltage driver stage may have an output impedance of 60-100 ohms or more. In contrast, the input impedance of the final stage transistor 160, 260 (e.g., $Z_2$, or the impedance looking into the gate of the final stage transistor 160, 260) may be just a few ohms (e.g., from 1-3 ohms). Thus, in an embodiment, the output impedance of the driver stage transistor 130, 230, $Z_1$ (e.g., less than about 10 ohms) may match the input impedance $Z_2$ of the final stage transistor 160, 260 (e.g., between about 1 ohm and 3 ohms). This provides a low transformation ratio, for an easy-to-realize impedance matching between the output of the driver stage transistor 130, 230 which has the low drain voltage supply and the input of the final stage transistor 160, 260.

As discussed previously, the power amplifier circuit 100 and the power amplifier IC 200 each include an interstage impedance matching network 140, 240, which is electrically coupled between the output/drain terminal 134, 234 of the driver stage transistor 130, 230 and the input/gate terminal 162, 262 of the final stage transistor 160, 260 with a high drain voltage supply. The interstage impedance matching network 140, 240 is configured to match the output impedance ($Z_1$) of the driver stage transistor 130, 230 to the input impedance ($Z_2$) of the final stage transistor 160, 260. Because the driver stage transistor 130, 230 for the carrier amplifier path has a significantly lower output impedance ($Z_1$) than the driver stage transistor for the peaking amplifier path, as discussed above, the interstage impedance matching network 140, 240 may be characterized by a significantly reduced impedance transformation ratio, when compared with the impedance transformation ratio that may be implemented in the two-stage power amplifier of the peaking amplifier path. For example, in one embodiment of the peaking amplifier path, a 28 V driver stage may has an impedance transformation ratio around 30:1 to 50:1 (e.g., from about 60-100 ohms $Z_1$ to about 2 ohms $Z_2$), while an embodiment of a low voltage driver stage for the carrier amplifier path may only require an impedance transformation ratio of less than about 10:1 (e.g., a ratio between about 2.5:1 and about 5:1, corresponding to an impedance transformation ratio from about 5-10 ohms $Z_1$ to about 2 ohms $Z_2$). Because a relatively low impedance transformation ratio may be warranted when implementing an embodiment of the carrier amplifier path, the circuit topology of the interstage impedance matching network 140, 240 may be relatively simple (e.g., fewer impedance matching stages and/or passive components), when compared with an interstage impedance matching network for the peaking amplifier path, in which a relatively high impedance transformation may be used. Accordingly, losses incurred through the interstage impedance matching network 140, 240 may be significantly reduced (e.g., by 3 dB or more) during operation at low total power amplifier power, when compared with the losses incurred through an interstage impedance matching network of the peaking amplifier path. However, this is compensated for by the high efficiency of the peaking amplifier final stage when operating at high gain levels.

Although the driver stage and final stage transistors 130, 160 and various elements of the input and interstage impedance matching networks 110, 140 are shown as singular components, the depiction is for the purpose of ease of explanation only. The driver stage and final stage transistors 130, 160 and/or certain elements of the input stage impedance matching network 110 and the interstage impedance matching network 140 each may be implemented as multiple components (e.g., connected in parallel or in series with each other).

The power amplifier circuit 100 and the power amplifier IC 200 of FIGS. 1 and 2 may be utilized as a single-path power amplifier, which receives an RF signal at the RF input 102, 202, amplifies the signal through the transistors 130, 160, 230, 260, and produces an amplified RF signal at RF output 104, 204. Alternatively, multiple instances of the power amplifier circuit 100 or the power amplifier IC 200 may be utilized to provide a multiple-path power amplifier, such as a Doherty power amplifier or another type of multi-path power amplifier.

Figure 5:
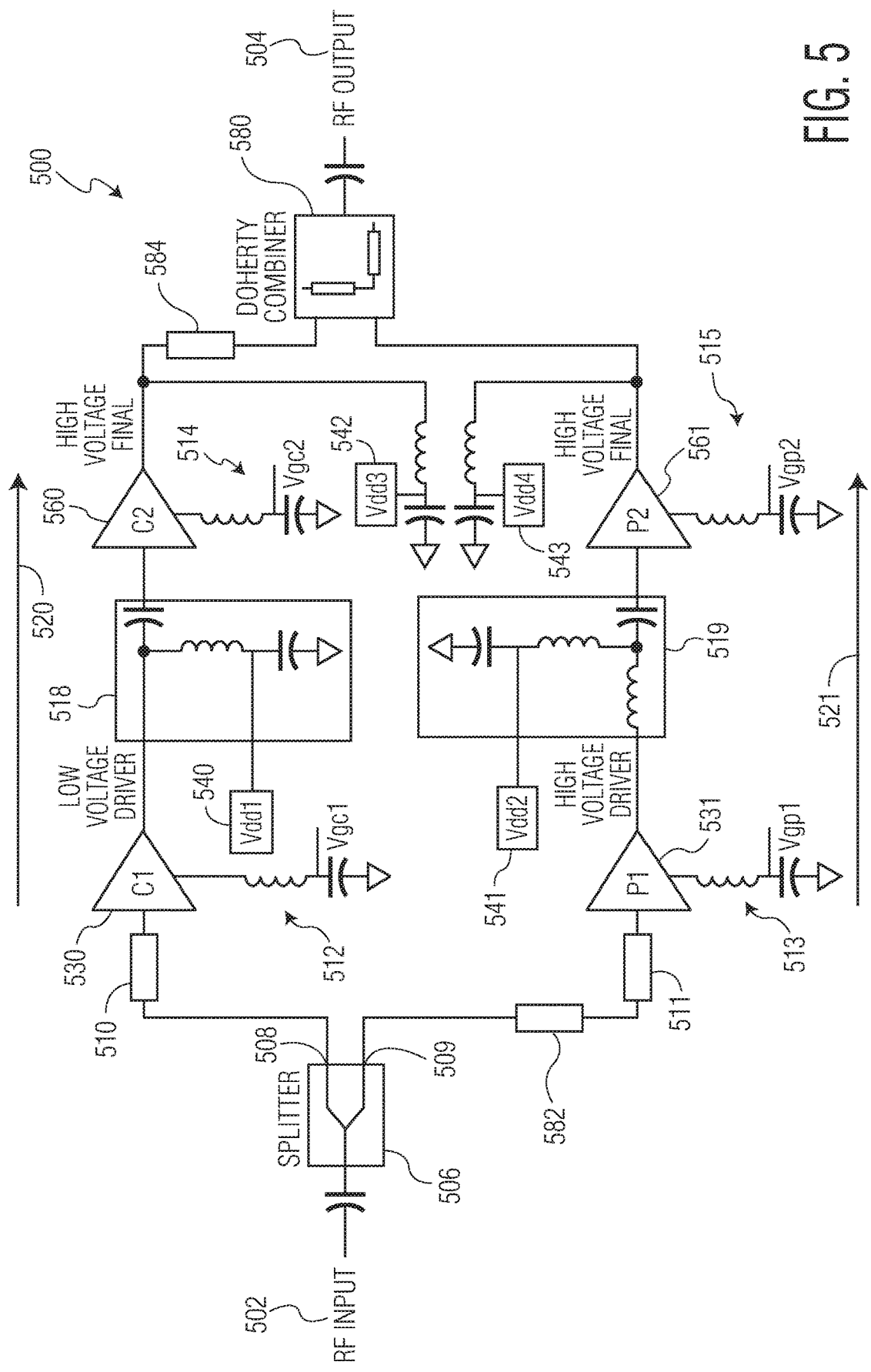
FIG. 5 is a simplified schematic diagram of a Doherty power amplifier, in accordance with an example embodiment.

For example, FIG. 5 is a simplified schematic diagram of a Doherty power amplifier 500, which may include two instances of the power amplifier circuit 100 or the power amplifier IC 200, in accordance with an example embodiment. The Doherty power amplifier 500 includes an input node 502, an output node 504, a power divider 506 (or splitter), a carrier amplifier path 520 with a two-stage carrier amplifier (including a driver stage amplifier 530 and a final stage amplifier 560), a peaking amplifier path 521 with a two-stage peaking amplifier (including a driver stage amplifier 531 and a final stage amplifier 561), a combiner 580 to combine the two paths and the output node 504 coupled to the combined output of the combiner 580 to produce an amplified RF signal from the Doherty power amplifier 500.

The power divider 506 is configured to divide the power of an input RF signal received at the input node 502 into carrier-path and peaking-path portions of the input signal. The carrier-path input signal is provided to the carrier amplifier path 520 at a power divider output 508, and the peaking-path input signal is provided to the peaking amplifier path 521 at a power divider output 509. During operation in a full-power mode when both the carrier and peaking amplifier paths 520, 521 are supplying current to the output, the power divider 506 divides the input signal power between the amplifier paths 520, 521. For example, the power divider 506 may divide the power equally, such that roughly one half of the input signal power is provided to each path 520, 521 (e.g., for a symmetric Doherty power amplifier configuration). Alternatively, the power divider 506 may divide the power unequally (e.g., for an asymmetric Doherty power amplifier configuration). Essentially, the power divider 506 divides an input RF signal supplied at the input node 502, and the divided signals are separately amplified along the carrier and peaking amplifier paths 520, 521. The amplified signals are then combined in phase at the combiner 580.

The Doherty power amplifier 500 is designed so that phase coherency between the carrier and peaking amplifier paths 520, 521 is maintained across a frequency band of interest to ensure that the amplified carrier and peaking signals arrive in phase at the combiner 580, and thus to ensure proper Doherty power amplifier operation. More specifically, the Doherty power amplifier 500 may have a "non-inverted" load network configuration. In the non-inverted load network configuration, the input circuit is configured so that the portion of the input signal supplied to the peaking amplifier path 521 is delayed by 90 degrees with respect to the portion of the input signal supplied to the carrier amplifier path 520 at the center frequency of operation, f0, of the Doherty power amplifier 500. To ensure that the carrier and peaking input RF signals are supplied to the carrier and peaking amplifier paths 520, 521 with about 90 degrees of phase difference. As is fundamental to proper Doherty power amplifier operation, the phase delay element 582 applies about 90 degrees of phase delay to the peaking-path input signal (i.e., the signal produced at power divider output 509). For example, the phase delay element 582 may include a quarter wave transmission line, or another suitable type of delay element with an electrical length of about 90 degrees.

The 90 degree phase delay difference at the inputs to the carrier and peaking amplifier paths 520, 521 is applied to compensate for a 90 degree phase delay applied to the signal between the output of the carrier amplifier path 520 and the combiner 580. This is achieved through an additional delay element 584 between the output of the carrier amplifier path 520 and the combiner 580. The additional delay element 584 also may be configured to perform an impedance inversion, and therefore the additional delay element 584 may be referred to as a "phase delay and impedance inversion" element or structure.

In an alternate embodiment, the Doherty power amplifier 500 may have an "inverted" load network configuration, in which the input circuit is configured so that the portion of the input signal supplied to the carrier amplifier path 520 is delayed by 90 degrees with respect to the portion of the input signal supplied to the peaking amplifier path 521 at the center frequency of operation, f0, of the Doherty power amplifier 500. In such a configuration, the input-side delay element 582 would be implemented between splitter output 508 and the input to the carrier amplifier path 520 (and removed from the input to the peaking amplifier path 521), and the output-side delay element 584 would be implemented between the output of the peaking amplifier path 521 and the combiner 580 (and removed from the output of the carrier amplifier path 520).

Each of the carrier amplifier path 520 and the peaking amplifier path 521 includes an input stage impedance matching network 510, 511 (input MNm and input MNp) and a multiple-stage power amplifier 530, 560, 531, 561 (e.g., an instance of the power amplifier circuit 100 implemented using the power amplifier IC 200 as described with reference to FIGS. 1, 2) coupled in series. The input stage impedance matching networks 510, 511 may be implemented between the power divider outputs 508, 509 and the inputs to the gates of the carrier-path and peaking-path driver stage amplifiers 530, 531. In each case, the input stage impedance matching networks 510, 511, may be used to incrementally increase the circuit impedance toward the load impedance and the source impedance. All or portions of the input stage impedance matching networks 510, 511 may be integrated with the IC (e.g., the power amplifier IC 200 as described with reference to FIG. 2) that includes the carrier and peaking-path driver stage amplifiers 530, 531. For example, the input stage impedance matching networks 510, 511 may be integrally formed with the IC, as is the case with the input stage impedance matching network 210 (FIG. 2). Alternatively, all or portions of the input stage impedance matching networks 510, 511 may be implemented on a PCB or other substrate to which the IC is mounted.

The multiple-stage power amplifiers of the carrier and peaking amplifier paths 520, 521 (e.g., an instance of the power amplifier circuit 100 implemented using the power amplifier IC 200 as described with reference to FIGS. 1, 2) are configured to amplify RF signals. According to various embodiments, the carrier and peaking-path driver stage amplifiers 530, 531 and final stage amplifiers 560, 561 each may be implemented, for example, using a field effect transistor (e.g., FETs 230, 260 as described with reference to FIG. 2). As discussed in detail above, the carrier-path driver stage amplifier 530 or more particularly the FET corresponding to the carrier-path driver stage amplifier 530 may be configured to operate with a relatively low output bias voltage (e.g., drain bias voltage). To provide the relatively-low output bias voltage to the driver stage amplifier 530, Doherty power amplifier 500 includes a driver stage low voltage (LV) drain supply 540 (e.g., the driver stage LV drain supply 156 as described with reference to FIG. 1), which provides the output bias voltage, Vdd1, to the carrier-path driver stage amplifier. As discussed previously, the driver stage LV drain supply 540 may be configured to provide a DC bias voltage of less than about 10 V to the carrier-path driver stage amplifier 530, and in a more particular embodiment, the driver stage LV drain supply 540 may be configured to provide a DC bias voltage of about 5 V to the carrier-path driver stage amplifier 530.

The peaking-path driver stage amplifier 531, or more particularly the FET corresponding to the peaking-path driver stage amplifier 531, and each final stage amplifier 560, 561, or more particularly the FET corresponding to each final stage amplifier 560, 561, may be configured to operate with a relatively high output bias voltage (e.g., drain bias voltage). To provide the relatively-high output bias voltage to the peaking-path driver stage amplifier 531 and the final stage amplifiers 560, 561, the Doherty power amplifier 500 includes a driver stage high voltage (HV) drain supply 541, which provides the output bias voltage, Vdd2, to the peaking-path driver stage amplifier 531. The driver stage HV drain supply may also provide the same output bias voltage Vdd2 to the carrier-path final stage amplifier 560 and the peaking-path final stage amplifier 561. As an alternative, one or more final stage high voltage (HV) drain supplies 542, 543 (e.g., the final stage HV drain supply 186 as described with reference to FIG. 1), may provide output bias voltages, Vdd3, Vdd4, to the respective carrier path and peaking path final stage amplifiers 560, 561. As discussed previously, the driver stage HV drain supply 541 and the final stage HV drain supplies 542, 543 may be configured to provide a DC bias voltage of 20 V or higher to the peaking-path driver stage amplifier 531 and the final stage amplifiers 560, 561, and in a more particular embodiment, the driver stage HV drain supply 541 may be configured to provide a DC bias voltage in a range of 28-32 V or higher to the peaking-path driver stage amplifier 531. The final stage HV drain supplies 541, 542 may be configured to provide a DC bias voltage in a range of 28-32 V or higher to the final stage amplifiers 560, 561.

With respect to the drain supplies provided to the transistor, multiple different configurations are possible. Three HV drain supplies are illustrated in the example of FIG. 5. A peaking-path driver stage HV drain supply 541 provides a voltage, Vdd2, to the peaking-path driver stage amplifier 531. A carrier-path final stage HV drain supply 542 provides a voltage, Vdd3, to the carrier-path final stage amplifier 560. A peaking-path final stage HV drain supply 543 provides a voltage, Vdd4, to the peaking-path driver stage amplifier 531. The three voltages, Vdd2, Vdd3, Vdd4 may be the same or different. In addition, the HV drain supplies 541, 542, 543 may be combined in whole or in part to provide drain supply voltages to each respective amplifier 531, 560, 561. As an example, the carrier path final stage HV drain supply 542 may be combined with the peaking-path HV drain supply 543 to supply a single voltage, Vdd3 or Vdd4, to both final stage transistors 560, 561. Alternatively, the peaking-path driver stage HV drain supply 541 may be combined with the peaking path final stage HV drain supply to supply a single voltage Vdd2 or Vdd4 to both peaking-path transistors 531, 561. As a further alternative, one HV drain supply may supply one or more voltages to all three transistors 531, 560, 561.

The driver stage LV drain supply 540 is coupled to the drain of the carrier-path driver stage amplifier 530 through a carrier-path interstage impedance matching network 518 which is located between the carrier-path driver stage amplifier 530 drain and the carrier-path final stage amplifier 560 and which includes at least a shunt circuit (e.g., a shunt inductor in series with a DC blocking capacitor, where the driver stage LV drain supply 540 is connected to a node between these components), and a series capacitor coupled between the driver stage amplifier 530 output and the final stage amplifier 560 input. In some embodiments, multiple shunt inductors, for example four shunt inductors may be used. The carrier-path interstage impedance matching network 518 matches the input of the carrier-path final stage amplifier 560 to the output of the carrier-path driver stage amplifier 530. The carrier path input impedance matching network 510, which may be configured in a manner similar to the input impedance matching network 110 of FIG. 1, matches the input of the driver stage amplifier 530 to an appropriate value, e.g. 50 Ohms.

The driver stage HV drain supply 541 is coupled to the drain of the peaking-path driver stage amplifier 531 through a peaking-path interstage impedance matching network 519 which is located between the peaking-path driver stage amplifier 531 drain and the peaking-path final stage amplifier 561 and which includes at least a shunt circuit (e.g., a shunt inductor in series with a DC blocking capacitor, where the driver stage HV drain supply 541 is connected to a node between these components), an optional series inductor and a series capacitor coupled between the driver stage amplifier 531 output and the final stage amplifier 561 input. In some embodiments, multiple shunt inductors, for example four shunt inductors may be used. The peaking-path interstage impedance matching network 519 matches the input of the peaking-path final stage amplifier 561 to the output of the peaking-path driver stage amplifier 531. The peaking path input impedance matching network 511, which may also be configured in a manner similar to the input impedance matching network 110 of FIG. 1, matches the input of the driver stage amplifier 531 to an appropriate value, e.g. 50 Ohms.

The Doherty power amplifier 500 also includes a DC gate bias circuit 512, 513, 514, 515 for each amplifier 530, 531, 560, 561. Each DC gate bias circuit includes a power supply Vgp1, Vgp2, Vgc1, Vgc2 coupled to a gate of a respective amplifier 530, 531, 560, 561, each through a shunt circuit (e.g., a shunt inductor in series with a DC blocking capacitor, where each power supply Vgp1, Vgp2, Vgc1, Vgc2 is connected to a node between these components).

During operation of the Doherty power amplifier 500, the carrier amplifier path 520 is biased to operate in class AB mode, and the peaking amplifier path 521 is biased to operate in class C mode. At low power levels, where the power of the input signal at the input node 502 is lower than the turn-on threshold level of the peaking amplifier path 521, the Doherty power amplifier 500 operates in a low-power (or back-off) mode in which the carrier amplifier path 520 is the only amplifier path supplying current to the output node 504. When the power of the input signal exceeds a threshold level of the peaking amplifier path 521, the Doherty power amplifier 500 operates in a high-power mode in which the carrier amplifier path 520 and the peaking amplifier path 521 both supply current to the output node 504. At this point, the peaking amplifier path 521 provides active load modulation at the combiner 580, allowing the current of the carrier amplifier path 520 to continue to increase linearly.

Referring also to FIG. 2, in an embodiment, the carrier amplifier path 520 may be implemented using a first instance of the power amplifier IC 200, where the driver stage transistor 230 corresponds to the driver stage amplifier 530 of the carrier amplifier path 520, and the final stage transistor 260 corresponds to the final stage amplifier 560 of the carrier amplifier path. Similarly, the peaking amplifier path 521 may be implemented using a second instance of the power amplifier IC 200 (although with a higher voltage driver stage amplifier 531 than for the carrier amplifier IC), where the driver stage transistor 230 corresponds to the driver stage amplifier 531 of the peaking amplifier path 521, and the final stage transistor 260 corresponds to the final stage amplifier 561 of the peaking amplifier path 521.

Figure 6:
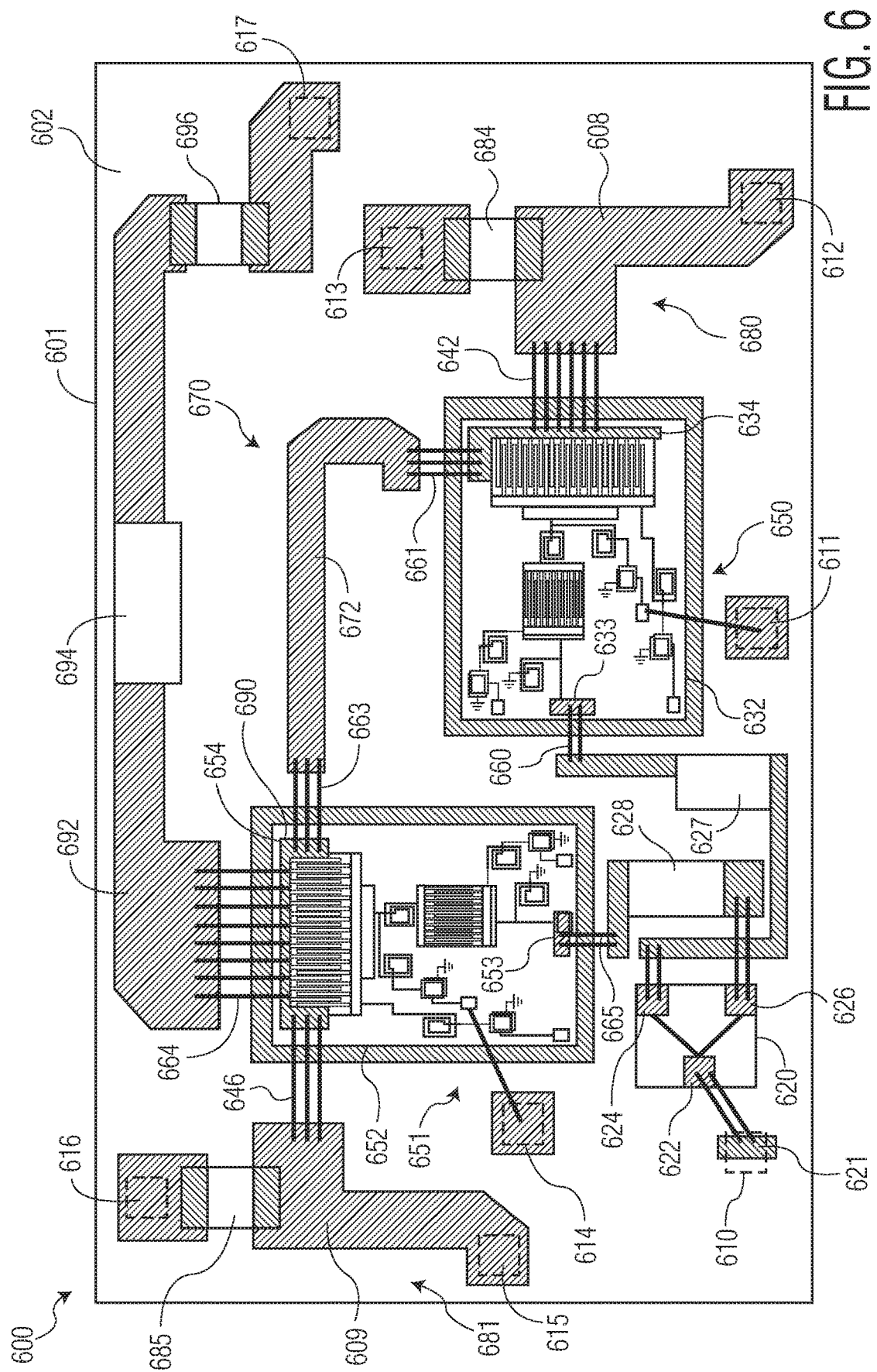
FIG. 6 is a top view of a Doherty power amplifier module, in accordance with an example embodiment.

Actual implementations of the Doherty power amplifier 500, or portions thereof, may be implemented in discrete, packaged power amplifier modules and devices. For example, FIG. 6 is a top view of a Doherty power amplifier module 600, in accordance with an example embodiment, in which a first and second amplifier die 632, 652 (e.g., two different instances of power amplifier die 200 as described with reference to FIG. 2) are used to provide the carrier and peaking amplifiers of a Doherty power amplifier. While the dies 632, 652 may be similar to each other, they are not identical, at least because, as described above the driver transistors are configured to operate with different bias voltages.

The Doherty power amplifier module 600 includes a substrate 601, a power splitter 620 (e.g., the power divider 506 as described with reference to FIG. 5), a carrier power amplifier die 632 (e.g., corresponding to carrier power amplifier path 520 as described with reference to FIG. 5), a peaking amplifier die 652 (e.g., corresponding to peaking amplifier path 521 as described with reference to FIG. 5), a phase delay and impedance inversion structure 670 (e.g., the additional delay element 584 which may be a phase delay and impedance inversion structure as described with reference to FIG. 5), and various other circuit elements, which will be discussed in more detail below. According to an embodiment, with the possible exception of the configurations of the RF output terminals 634, 654, and the different configurations of the pre-amplifier transistors (to support LV and HV output biasing, respectively), the carrier amplifier die 632 and the peaking amplifier die 652 may be structurally identical to each other, and to the power amplifier IC 200 discussed in detail in conjunction with FIG. 2.

The Doherty power amplifier module 600 may be implemented as a land grid array (LGA) module, for example. Accordingly, the substrate 601 has a component mounting surface 602 and a land surface (not numbered) that is on an opposite side of the substrate 601 from the component mounting surface 602. Conductive landing pads 610-617 of the LGA are exposed at the land surface, and are electrically connected through the substrate 601 to overlying conductive features (e.g., the contacts 608, 609, 692, and so on). Although the Doherty power amplifier module 600 is depicted as an LGA module, the Doherty power amplifier module 600 alternatively may be packaged as a pin grid array module, a quad flat no leads (QFN) module, or another type of package. Either way, the component mounting surface 602 and the components mounted to that component mounting surface 602 optionally may be covered with an encapsulant material to produce a surface-mount device (e.g., the power amplifier module 740 as described with reference to FIG. 7) that is suitable for incorporation into a larger electrical system (e.g., the transceiver module 700 as described with reference to FIG. 7). In an alternate embodiment, the components mounted to component mounting surface 602 could be contained within an air cavity, which is defined by various structures (not illustrated) overlying the component mounting surface 602.

The power splitter 620, which is coupled to the component mounting surface 602, includes an input terminal 622 (e.g., the input 502 as described with reference to FIG. 5) and two output terminals 624, 626 (e.g., the power divider outputs 508, 509 as described with reference to FIG. 5). The input terminal 622 is electrically coupled through wirebonds and conductive contact 621 to landing pad 610, which is configured to receive an input RF signal. The output terminals 624, 626 are electrically coupled (e.g., through additional wirebonds) to carrier and peaking amplifier paths, respectively. The power splitter 620 is configured to split the power of the input RF signal received through input terminal 622 into first and second RF signals (e.g., carrier and peaking signals), which are produced at the output terminals 624, 626. In addition, the power splitter 620 may include one or more phase shift elements configured to impart about a 90-degree phase difference between the first and second RF signals provided at the output terminals 624, 626 (e.g., to implement the phase shift applied by phase delay element 582 as described with reference to FIG. 5).

The first RF signal produced at the output terminal 624 is amplified through a carrier amplifier path. The carrier amplifier path includes an input circuit 627, a carrier amplifier die 632 (e.g., an instance of the power amplifier IC 200 as described with reference to FIG. 2), and a phase delay and impedance inversion structure 670 (e.g., the additional delay element 584 as described with reference to FIG. 5). The input circuit 627 is configured to provide proper impedance matching between the output terminal 624 of the first power splitter and the input to the carrier amplifier die 632. The input circuit 627 is electrically coupled (e.g., with the wirebonds 660, which correspond to the wirebonds 201 as described with reference to FIG. 2) to an RF input terminal 633 (e.g., the RF input 202 as described with reference to FIG. 2) of the carrier amplifier die 632, in order to provide an RF signal for amplification to the carrier amplifier die 632.

The carrier amplifier die 632 embodies a two-stage power amplifier which may be substantially similar to the two-stage power amplifier embodied in the power amplifier IC 200, where the driver stage transistor is configured to operate using a relatively low output bias voltage, and the final stage transistor is configured to operate using a relatively high output bias voltage. For the purpose of brevity, the details of the power amplifier IC 200 discussed in conjunction with FIG. 2 are not repeated here, but they are intended to apply also to the carrier amplifier die 632. Briefly, the electrical components of the carrier amplifier die 632 include the RF input terminal 633, an input stage impedance matching network (e.g., the input stage impedance matching network 210 as described with reference to FIG. 2), a driver stage transistor (e.g., the driver stage transistor 230 as described with reference to FIG. 2), an interstage impedance matching network (e.g., the interstage impedance matching network 240 as described with reference to FIG. 2), an output or final stage transistor (e.g., the final stage transistor 260 as described with reference to FIG. 2), and an RF output terminal 634 (e.g., the RF output 204 as described with reference to FIG. 2). The driver and final stage transistors are coupled in series between the RF input and output terminals 633, 634. The driver stage transistor is configured to apply a relatively low gain to the carrier signal, and the final stage transistor is configured to apply a relatively high gain to the carrier signal after preliminary amplification by the driver stage transistor.

According to an embodiment, the carrier amplifier die 632 also includes a first DC bias circuit 650 (e.g., the bias circuit 250 as described with reference to FIG. 2), which receives a relatively low bias voltage through a conductive landing pad 611 and a bondpad on the carrier amplifier die 632 (e.g., the node and contact 206 as described with reference to FIG. 2). The first DC bias circuit 650 conveys the relatively low DC bias voltage from the conductive landing pad 611 to the output (e.g., the drain terminal) of the driver stage transistor, as discussed in detail above in conjunction with FIG. 2.

A second DC bias circuit 680 (e.g., the second output (drain) bias circuit 280 as described with reference to FIG. 2) is implemented off chip, in an embodiment, and the second DC bias circuit 680 receives a relatively high DC bias voltage through a landing pad 612. The second DC bias circuit 680 may include a contact 608 (e.g., the node and contact 208 as described with reference to FIG. 2) on the component mounting surface 602, and wirebonds 642, which electrically couple the contact 608 with the RF output terminal 634 (thus electrically connecting landing pad 612 and the output of the final stage transistor of the carrier amplifier die 632). The second DC bias circuit 680 conveys the relatively high bias voltage from the landing pad 612 to the output (e.g., the drain terminal) of the final stage transistor, as discussed in detail above in conjunction with FIG. 2. Besides the DC bias circuits 650, 680 for the drains, the Doherty power amplifier module 600 also may include additional carrier amplifier bias circuits to provide gate bias voltages to the driver stage and final stage transistors of the carrier amplifier die 632.

As discussed in conjunction with FIG. 2, each of the first DC bias circuit 650 and the second DC bias circuit 680 may be configured as a shunt-L circuit, where each includes an inductive element and a capacitor connected in series between a transistor output and a ground reference voltage, with an intermediate node or contact between each inductor/capacitor pair. The inductor/capacitor pair associated with the first DC bias circuit 650 may be integrally formed with the carrier amplifier die 632, and the inductor/capacitor pair associated with DC bias circuit 680 may include wirebonds 642, contact 608, and capacitor 684. A first terminal (or electrode) of capacitor 684 is coupled to contact 608, and a second terminal of capacitor 684 may be coupled to a ground reference through landing pad 613.

An amplified carrier signal is produced by the carrier amplifier die 632 at the RF output terminal 634. The amplified carrier signal is conveyed through the phase delay and impedance inversion structure 670 to the RF output terminal 654 of the peaking amplifier die 652. More specifically, the phase delay and impedance inversion structure 670 includes a series combination of a first wirebond array 661, an inverter line 672 connected to the substrate 601, and a second wirebond array 663. The phase delay and impedance inversion structure 670 has an electrical length of about 90 degrees, in an embodiment.

As will be discussed in more detail below, the RF output terminal 654 of the peaking amplifier die 652 functions as the combining node 690 (e.g., the combiner 580 as described with reference to FIG. 5) of the Doherty power amplifier, and the phase delay and impedance inversion structure 670 functions to phase align the amplified RF carrier signal with an amplified RF peaking signal produced by the peaking amplifier die 652.

Moving back to the power splitter 620, the second RF signal produced at output terminal 626 is amplified through the peaking amplifier path. The peaking amplifier path includes an input circuit 628, and a peaking amplifier die 652 (e.g., an instance of the power amplifier IC 200 as described with reference to FIG. 2). The input circuit 628 is configured to provide proper impedance matching between the output terminal 626 of the second power splitter and the input to the peaking amplifier die 652. The input circuit 628 is electrically coupled (e.g., with the wirebonds 665, which correspond to the wirebonds 201 as described with reference to FIG. 2) to an RF input terminal 653 (e.g., the RF input 202 as described with reference to FIG. 2) of the peaking amplifier die 652, in order to provide an RF signal for amplification to the peaking amplifier die 652.

The peaking amplifier die 652 embodies a two-stage power amplifier, which may be substantially similar to the two-stage power amplifier embodied in the power amplifier IC 200, except that the driver stage transistor and the final stage transistor may be configured to operate using relatively high (and potentially the same) output bias voltages. While the dies 632, 652 may be similar in some embodiments, the carrier amplifier die 632 has a low voltage driver stage and the peaking amplifier die has a high voltage driver stage. As a result, when the dies are optimized for size and efficiency the die configurations will be different. For example, the carrier amplifier driver stage may have a significantly shorter drift region 350 of FIG. 3, than the peaking amplifier driver stage to operate with a lower output bias voltage.

For the purpose of brevity, the details of the power amplifier IC 200 discussed in conjunction with FIG. 2 are not repeated here, but they are intended to apply also to the peaking amplifier die 652. Briefly, the electrical components of the peaking amplifier die 652 include the RF input terminal 653, an input stage impedance matching network (e.g., the input stage impedance matching network 210 as described with reference to FIG. 2), a driver stage transistor (e.g., the driver stage transistor 230 as described with reference to FIG. 2), an interstage impedance matching network (e.g., the interstage impedance matching network 240 as described with reference to FIG. 2), an output or final stage transistor (e.g., the final stage transistor 260 as described with reference to FIG. 2), and an RF output terminal 654 (e.g., the output/drain terminal 264 as described with reference to FIG. 2).

The driver and final stage transistors are coupled in series between the input and output terminals 653, 654. The driver stage transistor is configured to apply a relatively high gain to the peaking signal, and the final stage transistor is configured to apply a relatively low gain to the peaking signal after preliminary amplification by the driver stage transistor.

According to an embodiment, the peaking amplifier die 652 also includes a first DC bias circuit 651 (e.g., the bias circuit 250 as described with reference to FIG. 2), which receives a relatively high bias voltage from a first DC voltage source (not shown) through a conductive landing pad 614 and a bondpad on the peaking amplifier die 652 (e.g., the node and contact 206 as described with reference to FIG. 2). The first DC bias circuit 651 conveys the relatively high DC bias voltage from the conductive landing pad 614 to the output (e.g., the drain terminal) of the driver stage transistor, as discussed in detail above in conjunction with FIG. 2.

A second DC bias circuit 681 (e.g., the second output (drain) bias circuit 280 as described with reference to FIG. 2) is implemented off chip, in an embodiment, and the second DC bias circuit 681 receives a relatively high DC bias voltage through a landing pad 615. The second DC bias circuit 681 may include a conductive contact 609 (e.g., the node and contact 208 as described with reference to FIG. 2) on the component mounting surface 602, and wirebonds 646, which electrically couple the contact 609 with the RF output terminal 654 (thus electrically connecting through the landing pad 615 and the output of the final stage transistor of the peaking amplifier die 652). The second DC bias circuit 681 conveys the relatively high bias voltage from the landing pad 615 to the output (e.g., the drain terminal) of the final stage transistor, as discussed in detail above in conjunction with FIG. 2. Besides the DC bias circuits 651, 681 for the drains, the Doherty power amplifier module 600 also may include additional peaking amplifier bias circuits to provide gate bias voltages to the driver stage and final stage transistors of the peaking amplifier die 652. These bias circuits may be internal or external to the Doherty power amplifier module 600. As described with reference to FIG. 5, a high voltage drain supply 541, 543 is provided to the drains of both the peaking amplifier driver stage amplifier 531 and to the peaking amplifier final stage amplifier 561 in contrast to the relatively low voltage drain supply 540 provided to the drain of the carrier amplifier driver stage amplifier 530.

As discussed in conjunction with FIG. 2, each of the first DC bias circuit 651 and the second DC bias circuit 681 may be configured as a shunt-L circuit, where each includes an inductive element and a capacitor connected in series between a transistor output and a ground reference voltage, with an intermediate node or contact between each inductor/capacitor pair. The inductor/capacitor pair associated with DC bias circuit 651 may be integrally formed with the peaking amplifier die 652, and the inductor/capacitor pair associated with DC bias circuit 681 may include wirebonds 646, a contact 609, and a capacitor 685. A first terminal (or electrode) of the capacitor 685 is coupled to the contact 609, and a second terminal of the capacitor 685 may be coupled to a ground reference through a landing pad 616.

An amplified peaking signal is produced by the peaking amplifier die 652 at the RF output terminal 654. In an embodiment, and as mentioned above, the RF output terminal 654 also receives the amplified carrier signal through the phase delay and impedance inversion structure 670, and the RF output terminal 654 functions as a combining node 690 (e.g., the combiner 580 as described with reference to FIG. 5) at which the amplified carrier signal is combined, in phase, with the amplified peaking signal.

According to an embodiment, the RF output terminal 654 (and thus combining node 690) is electrically coupled to a conductive output transformer line 692 at the component mounting surface 602 with a wirebond array 664. An output impedance matching network 694 and/or a decoupling capacitor 696 may be coupled along the conductive output transformer line 692, in an embodiment. The output impedance matching network 694 functions to present the proper load impedance to the combining node 690. Although the detail is not shown in FIG. 6, the output impedance matching network 694 may include various discrete and/or integrated components (e.g., capacitors, inductors, and/or resistors) to provide the desired impedance matching. Ultimately, the conductive output transformer line 692 is electrically coupled through the substrate 601 to a conductive landing pad 617. The conductive landing pad 617 functions as the RF output node for the Doherty power amplifier module 600.

An embodiment of a module (e.g., the Doherty power amplifier module 600 as described with reference to FIG. 6) or another device or module that includes one or more instances of the power amplifier 100 and/or the power amplifier IC 200 may be further integrated into a larger electrical system. For example, the Doherty power amplifier module 600 (or another power amplifier device that includes an embodiment of an amplifier die) may be included in a transmitter lineup of an RF transmitter or an RF transceiver.

Figure 7:
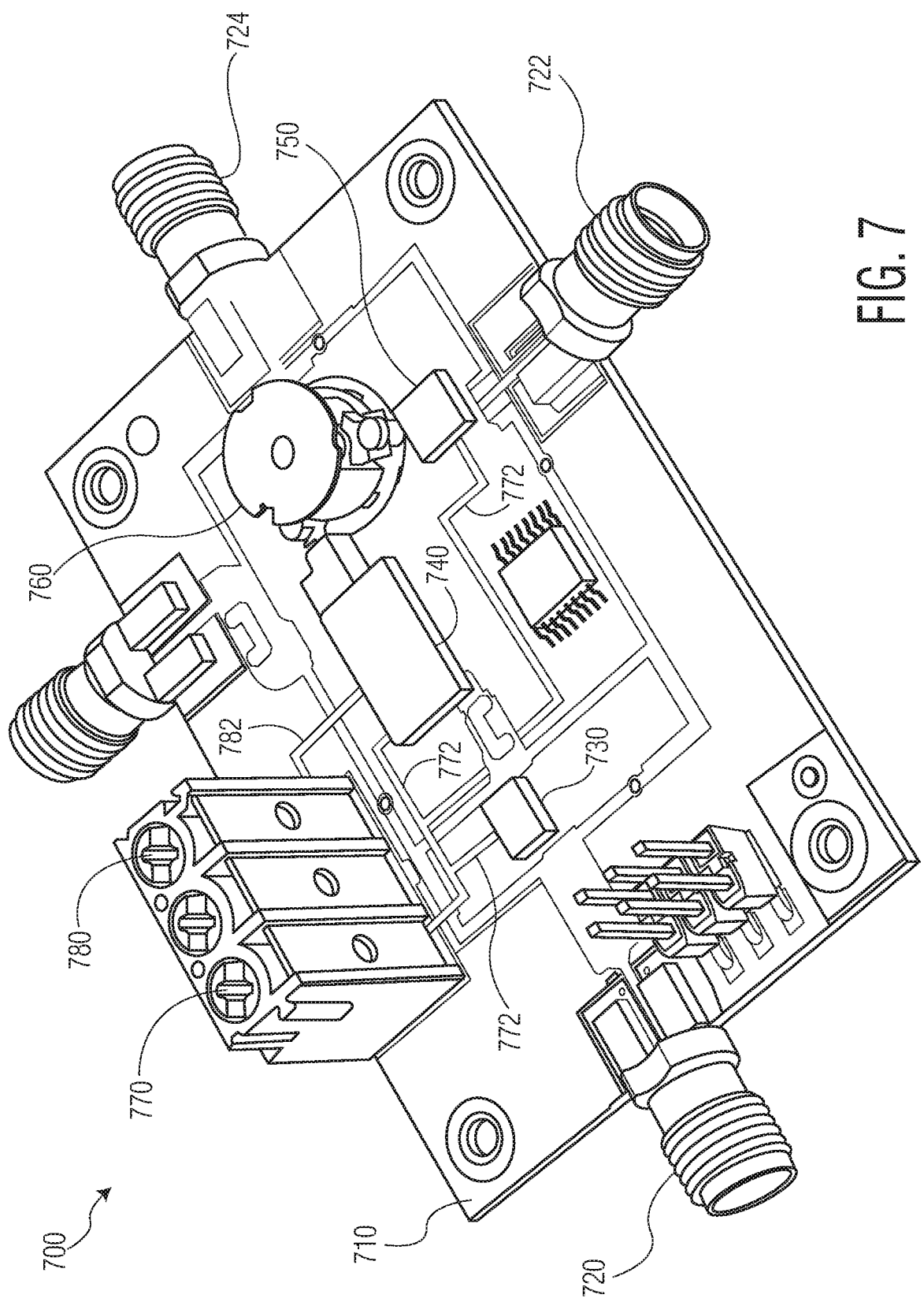
FIG. 7 is a perspective view of a transceiver module, in accordance with an example embodiment.

For example, FIG. 7 is a perspective view of a transceiver module 700, in accordance with an example embodiment. Essentially, the transceiver module 700 houses a transmitter lineup and a receiver lineup. The components of the transceiver module 700 are mounted on (or coupled to) a system substrate 710, which may be, for example, a multi-layer PCB or other type of substrate.

The transmitter lineup includes an RF transmit (TX) input connector 720, a pre-amplifier device 730, a power amplifier module 740, a duplexer 760 (e.g., a circulator, in the illustrated embodiment), and an RF transmit-out/receive-in (TX-out/RX-in) connector 724 coupled in series. The RF transmit input connector 720 is configured to be coupled to an external RF signal source, such as a transmit processor (not illustrated), which produces an analog, modulated RF transmit signal that is to be amplified and transmitted to a remote receiver. The RF transmit input connector 720 receives the RF transmit signal from the RF signal source, and conveys the signal to a first substrate transmission line between the RF transmit input connector 720 and the pre-amplifier device 730. The pre-amplifier device 730 functions as a first amplification stage, which applies a first gain to the RF transmit signal. The pre-amplified RF transmit signal is then conveyed through a second substrate transmission line between the pre-amplifier device 730 and the power amplifier module 740.

For example, the power amplifier module 740 may be a Doherty power amplifier module (e.g., the Doherty power amplifier module 600 as described with reference to FIG. 6). In any event, the power amplifier module 740 includes at least one amplifier with a low voltage driver stage amplifier (e.g., the driver stage transistor 130, 230, 530, as described with reference to FIGS. 1, 2, 5) and a high voltage final stage power amplifier (e.g., the final stage amplifiers 160, 260, 560, as described with reference to FIGS. 1, 2, 5), and another amplifier with a high voltage driver stage amplifier (e.g., the driver stage transistor 531 as described with reference to FIG. 5) and a high voltage final stage power amplifier (e.g., the final stage transistor 561 as described with reference to FIG. 5).

The power amplifier module 740 functions as a final amplification stage, which applies additional gain to the RF transmit signal, and the amplified RF transmit signal is then conveyed through a third substrate transmission line between the power amplifier module 740 and the duplexer 760. The duplexer 760 is used to isolate the transmitter and receiver. In various embodiments, the duplexer 760 may include a circulator (as illustrated), an active transmit/receive switch, or another type of duplexer. In any event, the duplexer 760 conveys the amplified RF transmit signal to a fourth substrate transmission line between the duplexer 760 and the RF transmit-out/receive-in connector 724.

The RF transmit-out/receive-in connector 724 is configured to be coupled to a load, such as an antenna, which functions to communicate the amplified RF transmit signal to a remote receiver (e.g., to radiate the amplified RF transmit signal over an air interface). The RF transmit-out/receive-in connector 724 also functions to receive an RF receive signal from the load (e.g., from an antenna, and ultimately from a remote transmitter), and to convey the RF receive signal to the receiver lineup.

The receiver lineup includes the RF transmit-out/receive-in connector 724, the duplexer 760, a low noise amplifier (LNA) device 750, and an RF receive (RX) output connector 722 coupled in series. Upon receiving an RF receive signal from the load (e.g., an antenna), the RF transmit-out/receive-in connector 724 conveys the RF receive signal to the duplexer 760 through the fourth substrate transmission line. The duplexer 760 then conveys the RF receive signal over a fifth substrate transmission line to the LNA device 750. The LNA device 750 amplifies the RF receive signal, and conveys the amplified RF receive signal to a sixth substrate transmission line between the LNA device 750 and the RF receive output connector 722. The RF receive output connector 722 is configured to be coupled to a receive processor (not illustrated), which processes (e.g., demodulates, converts to digital, and otherwise processes) the RF receive signal.

In addition to the above-described circuitry, the transceiver module 700 also includes a low voltage power supply connector 770, a high voltage power supply connector 780, and potentially additional power supply connectors (not discussed below). The low voltage power supply connector 770 and the high voltage power supply connector 780 are configured to be coupled to a low voltage power supply (e.g., the driver stage LV drain supply 156, 540 as described with reference to FIGS. 1, 5) and a high voltage power supply (e.g., the final stage HV drain supply 186, 541, 542, 543 as described with reference to FIGS. 1, 5), respectively. As described previously, the low voltage power supply (not illustrated) may supply a relatively low DC voltage (e.g., less than 10 V, such as 5 V, or another relatively low voltage), and the high voltage power supply (not illustrated) may supply a relatively high DC voltage (e.g., 28-32 V, or another relatively high voltage).

The low voltage power supply connector 770 is coupled to low voltage substrate conductors 772, which conduct the low voltage DC power received through the low voltage power supply connector 770 to the pre-amplifier device 730, the power amplifier module 740, and the LNA device 750, in an embodiment. The low voltage substrate conductors 772 form a portion of a conductive path between the low voltage power supply connector 770 and the pre-amplifier device 730, the power amplifier module 740 (and more specifically, the outputs/drains of the carrier-path driver stage transistor(s) included in the power amplifier module 740), and the LNA device 750. Accordingly, the transceiver module 700 is configured so that the pre-amplifier device 730, the power amplifier module 740, and the LNA device 750 may utilize the same low voltage power supply for operation. When the duplexer 760 is implemented as an active device (e.g., an active transmit/receive switch), the duplexer 760 also may receive and utilize the low voltage DC power for its operations. In the power amplifier module 740 (e.g., the Doherty power amplifier module 600 as described with reference to FIG. 6), contacts coupled to the low voltage substrate conductors 772 (e.g., the conductive landing pad 611, 614 as described with reference to FIG. 6) convey the low voltage DC power through bias circuits (e.g., the bias circuit 650, as described with reference to FIG. 6) to the output/drain terminals (e.g., the output/drain terminals 134, 234 as described with reference to FIGS. 1, 2, not numbered in FIG. 6) of the carrier-path driver stage transistor(s) (e.g., the driver stage transistors 130, 230 as described with reference to FIGS. 1, 2, not numbered in FIG. 6).

The high voltage power supply connector 780 is coupled to high voltage substrate conductors 782, which conduct the high voltage DC power received through the high voltage power supply connector 780 to the power amplifier module 740. The high voltage substrate conductors 782 form a portion of a conductive path between the high voltage power supply connector 780 and the power amplifier module 740 (and more specifically, the outputs/drains of the peaking-path driver stage and the final stage transistor(s) included in the power amplifier module 740). In the power amplifier module 740 (e.g., the Doherty amplifier module 600 as described with reference to FIG. 6), contacts coupled to the high voltage substrate conductors 782 (e.g., the landing pads 612, 615 as described with reference to FIG. 6) convey the high voltage DC power through bias circuits (e.g., the DC bias circuits 651, 680, 681 as described with reference to FIG. 6) to the output/drain terminals (e.g., the terminals 164, 264, 634, 654 as described with reference to FIGS. 1, 2, 6) of the peaking-path driver stage transistors and the final stage transistors (e.g., the transistors 160, 260 as described with reference to FIGS. 1, 2, not numbered in FIG. 6).

As indicated above, the described embodiments may leverage the use of a single low voltage power supply (e.g., a standardly available 5 V supply) to power multiple RF subsystems of an RF transmitter or transceiver (e.g., the pre-amplifier device 730, power amplifier module 740, duplexer 760, and/or a LNA device 750). Accordingly, system costs associated with unique power supplies for some or all of these subsystems may be avoided.

Figure 8:
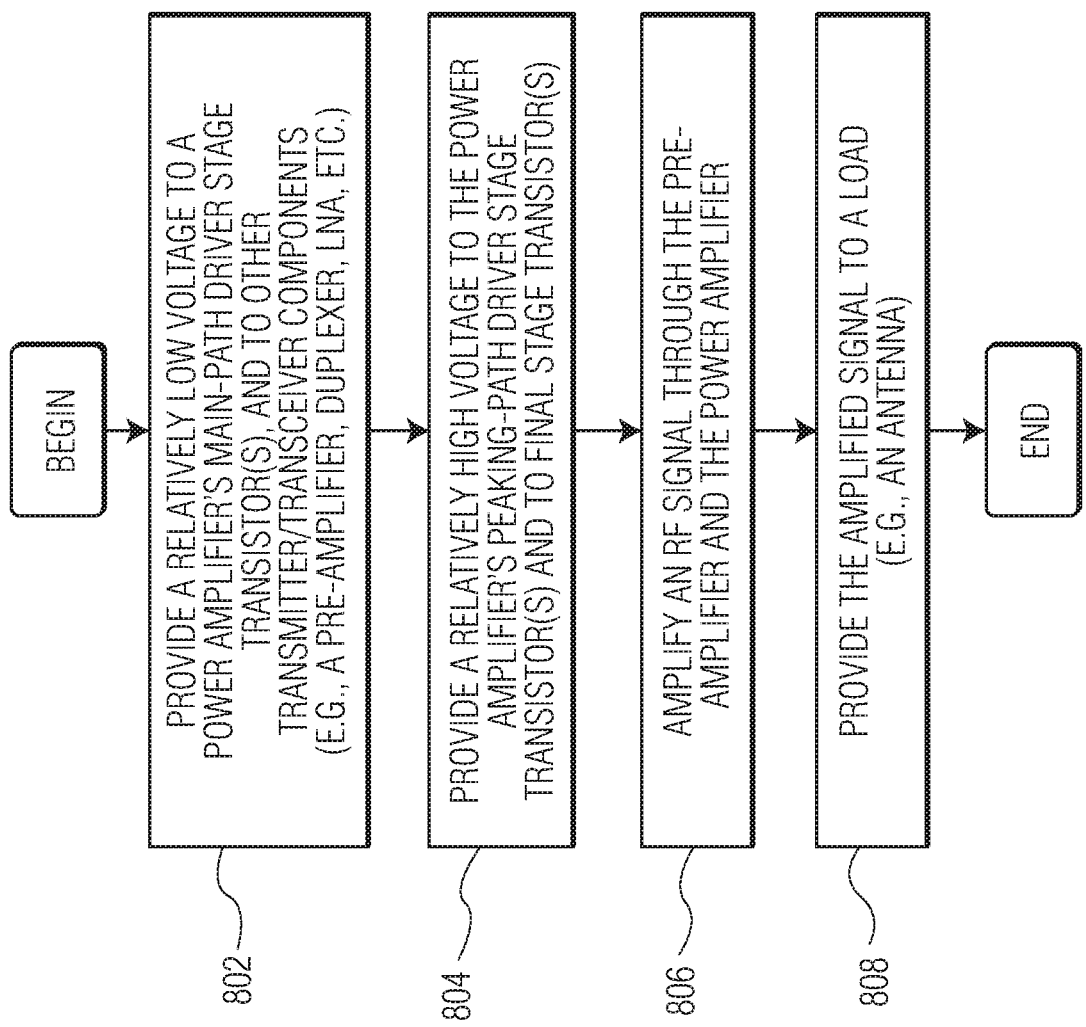
FIG. 8 is a flowchart of a method for operating an amplifier, in accordance with an example embodiment.

FIG. 8 is a flowchart of a method for operating a power amplifier with a low voltage carrier-path driver stage amplifier, a high voltage peaking-path driver stage amplifier, and high voltage carrier-path and peaking-path final stage amplifiers, in accordance with an example embodiment. The method may be performed, for example, using various embodiments of a power amplifier (e.g., the amplifiers 100, 200 as described with reference to FIG. 1, 2), a Doherty power amplifier or an amplifier module (e.g., the Doherty power amplifier 500 and the Doherty power amplifier module 600 as described with reference to FIGS. 5, 6), and/or a transmitter or transceiver (e.g., as embodied in transceiver module 700 as described with reference to FIG. 7).

The method may begin, in step 802, by providing a relatively low DC voltage (e.g., under 10 V, such as about 5 V) to bias the output(s) (e.g., the drain terminal(s)) of the carrier-path driver stage transistor(s) (e.g., the transistors 130, 230, 530 as described with reference to FIGS. 1-3, 5) of a multi-stage power amplifier or amplifier module (e.g., the power amplifier circuit 100, 200, 500, or the Doherty power amplifier module 600, 740 as described with reference to FIGS. 1, 2, 5-7). Step 802 also may include providing the relatively low DC voltage to additional components of a transmitter or transceiver system (e.g., the transceiver module 700 as described with reference to FIG. 7). For example, as discussed previously, the relatively low DC voltage may be provided also to a pre-amplifier (e.g., the pre-amplifier device 730 as described with reference to FIG. 7), a duplexer, an LNA (e.g., the LNA device 750 as described with reference to FIG. 7), and/or other system components that are configured to operate using the same relatively low DC voltage that is supplied to the power amplifier's carrier-path driver stage transistor(s). When the additional components are included in a single module (e.g., the transceiver module 700 as described with reference to FIG. 7), for example, a first DC voltage supply configured to supply the relatively low DC voltage may be coupled to a first power supply connector of the module (e.g., the low voltage power supply connector 770 as described with reference to FIG. 7), and conductors (e.g., the low voltage substrate conductors 772 as described with reference to FIG. 7) may be used to convey the DC voltage to an amplifier module (e.g., the power amplifier module 740 as described with reference to FIG. 7) that includes the power amplifier's carrier-path driver stage transistor(s) and to the additional components.

In step 804, a relatively high DC voltage (e.g., about 28-32 V or higher) is provided to bias the output(s) (e.g., the drain terminal(s)) of the power amplifier's peaking-path driver stage transistor(s), (e.g. the transistors 531 as described with reference to FIG. 5) and to bias the final stage transistor(s) (e.g., the transistors 160, 260, 560, 561 as described with reference to FIGS. 1-3, 5) of a multi-stage power amplifier or amplifier module (e.g., the power amplifier circuit 100, 200, 500, or the Doherty power amplifier module 600, 740 as described with reference to FIGS. 1, 2, 5-7). When the final stage transistor(s) are included in a module (e.g., the transceiver module 700 as described with reference to FIG. 7), for example, a second DC voltage supply configured to supply the relatively high DC voltage may be coupled to a second power supply connector of the module (e.g., the high voltage power supply connector 780 as described with reference to FIG. 7), and conductors (e.g., the high voltage substrate conductors 782 as described with reference to FIG. 7) may be used to convey the DC voltage to an amplifier module (e.g., the power amplifier module 740 as described with reference to FIG. 7) that includes the driver stage transistor(s) and final stage transistor(s). Additional bias voltages (e.g., the input/gate bias voltages) also may be provided through additional connector(s) and conductor(s).

In step 806, an RF signal is then provided (e.g., through RF input terminals 102, 202, 502, 633, 653, 720 as described with reference to FIGS. 1, 2, 5-7) to the pre-amplifier device (e.g., the pre-amplifier device 730 as described with reference to FIG. 7), when included, and to the power amplifier (e.g., the power amplifier circuit 100, 200, 500, or the Doherty power amplifier module 600, 740 as described with reference to FIGS. 1, 2, 5-7), which proceed to amplify the received RF signal. In step 808, the amplified RF signal is then provided to a load (e.g., to an antenna or other load), and the method ends.

Figure 9A:
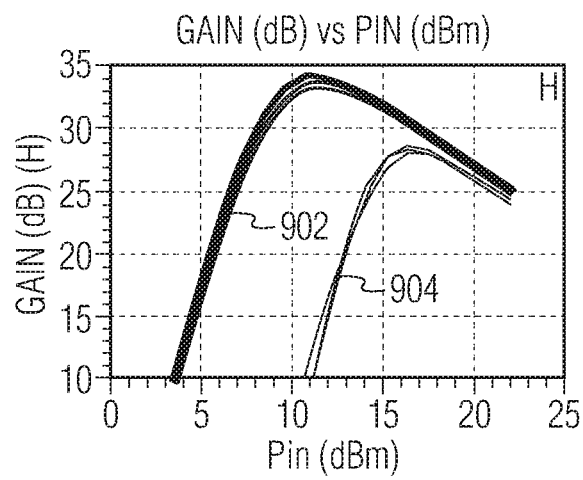
FIGS. 9A, 9B, and 9C are graphs of simulated performance of a Doherty power amplifier.

FIG. 9A is a graph of gain (dB) on the vertical axis versus input power (dBm) on the horizontal axis to show the gain of two different peaking power amplifiers. One has a 5V-peaking amplifier driver stage as shown on the right side curve 902 and the other has a 28V-peaking amplifier driver stage as shown on the left side curve 904. Both amplifiers are biased at class C operation, with the same offset as with Class AB operation. The curve 902 for the peaking power amplifier with the 28V-driver stage reaches maximum gain 5 dB earlier, that is with 5 dBm less input power, than the curve 904 for the peaking power amplifier with the 5V-peaking amplifier driver stage. The curve 902 for the peaking power amplifier with the 28V-peaking amplifier driver stage also shows a 5 dB higher maximum achievable gain. With this significant gain advantage of the peaking amplifier, the input power can be split equally between carrier and peaking amplifier paths in the corresponding Doherty amplifier. As the result, the Doherty gain is improved by ~2 dB.

Symmetrical or asymmetrical in the context of a Doherty power amplifier refers to the relative power capability of the carrier amplifier path compared to the peaking amplifier path. A typical asymmetrical Doherty power amplifier, if it uses the same technology for the driver stages for both carrier and peaking paths, requires an unequal power split between the respective inputs to the two paths. The peaking-path final stage amplifier is typically a higher power device and usually has a lower gain with class C bias. When peaking path has a high-voltage driver stage, while the carrier path has a low-voltage driver stage, the peaking path has a much higher gain, and it no longer needs an unequal splitter at the input. As a result, the Doherty gain is improved. An equal power split into the two paths is a viable configuration. Splitting more power to the carrier path is also a viable configuration. The best power split for any particular implementation depends on the gain difference between the carrier path and the peaking path. For example, if the carrier-path amplifier has 38 dB gain, and there is an equal split of the input power, then this results in a Doherty gain of 35 dB. But with an unequal split (for example −5 dB/−3 dB into the two carrier and peaking paths, respectively), the Doherty gain becomes 33 dB.

Figure 9B:
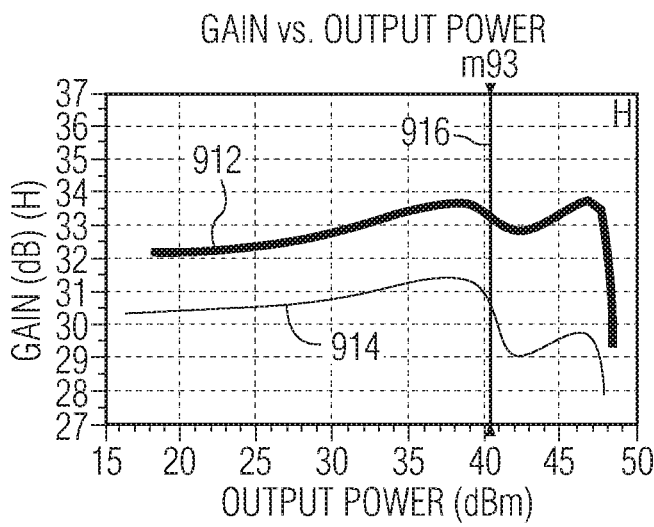

FIG. 9B is a graph of gain (dB) on the vertical axis versus output power (dBm) on the horizontal axis for the two Doherty power amplifiers. The higher gain of a Doherty power amplifier with a 28V-peaking amplifier driver stage is shown by the upper curve 912 and the lower gain of a Doherty power amplifier with a 5V-peaking amplifier driver stage is shown by the lower curve 914. The higher peaking amplifier gain with the 28V-driver stage (FIG. 9A) leads to a more favorable peaking turn-on characteristic in Doherty operation. To maintain a similar efficiency at 8 dB back off from peak power, the AMAM step with the curve 912 for the Doherty power amplifier with the 28V-peaking amplifier driver stage, indicated at line 916 at 40.5 dBm, is ~1 dB smaller than the curve 914 for the Doherty power amplifier with the 5V-peaking amplifier driver stage. This indicates potential significant improvement of the linearizability of the Doherty power amplifier and essentially enhances the linearized efficiency.

Figure 9C:
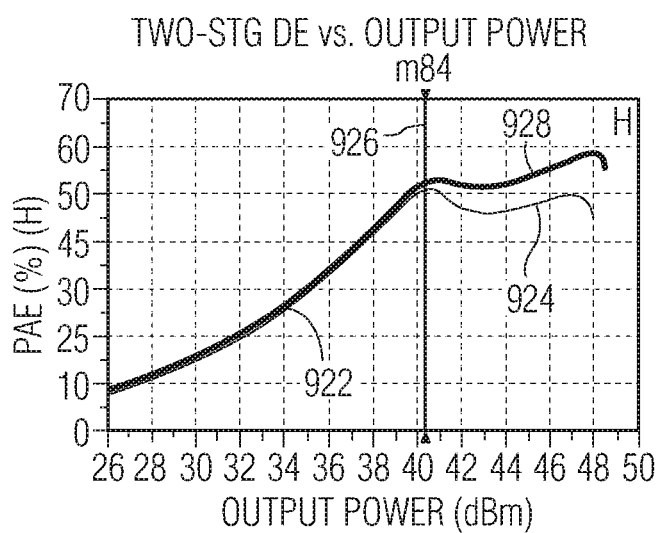

FIG. 9C is a graph of power added efficiency (PAE) with PAE (%) on the vertical axis versus output power (dBm) on the horizontal axis for the same two Doherty power amplifiers. The Doherty power amplifier with the 28V-peaking amplifier driver stage is shown on the upper curve 922, 928 and indicates an improved and increasing PAE at 928 after 40.5 dBM indicated at line 926, as compared to the lower curve 924 of the Doherty power amplifier with the 5V-peaking amplifier driver stage which tapers off in PAE after 40.5 dBm at line 926.

The Doherty power amplifiers as simulated in the results of FIGS. 9B, 9C with a low-voltage carrier-path driver stage and a high-voltage peaking-path driver stage provide a linearized efficiency enhancement avenue while retaining the Doherty gain. At the same time, the Doherty power amplifiers are easily integrated into an all silicon technology system of silicon-based dies, or into a system with silicon-based driver amplifiers and III-V-based final amplifiers. Such Doherty power amplifiers are well-suited to next generation 5G massive MIMO applications, and LDMOS products having a 2-3 point linearizable efficiency enhancement with comparable gain (to high-voltage driver Doherty power amplifiers) while maintaining low cost.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. Many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty power amplifier comprising:
   a carrier-path driver stage transistor having a driver stage input and a driver stage output, wherein the carrier-path driver stage transistor is configured to operate using a first bias voltage at the driver stage output of the carrier-path driver stage transistor, and the carrier-path driver stage transistor has a first breakdown voltage and a first output impedance;
   a carrier-path final stage transistor having a final stage input and a final stage output, wherein the final stage input of the carrier-path final stage transistor is electrically coupled to the driver stage output of the carrier-path driver stage transistor, and the carrier-path final stage transistor is configured to operate using a second bias voltage at the final stage output of the carrier-path final stage transistor, and wherein the second bias voltage is at least twice as large as the first bias voltage;
   a peaking-path driver stage transistor having a driver stage input and a driver stage output, wherein the peaking-path driver stage transistor is configured to operate using the second bias voltage at the driver stage output of the peaking-path driver stage transistor, and wherein the peaking-path driver stage transistor has a second breakdown voltage that is significantly higher than the first breakdown voltage of the carrier-path driver stage transistor, and a second output impedance that is significantly higher than the first output impedance of the carrier-path driver stage transistor; and
   a peaking-path final stage transistor having a final stage input and a final stage output, wherein the final stage input of the peaking-path final stage transistor is electrically coupled to the driver stage output of the peaking-path driver stage transistor, and the peaking-path final stage transistor is configured to operate using the second bias voltage at the final stage output of the peaking-path final stage transistor.

2. The Doherty power amplifier of claim 1, wherein the first bias voltage is 5 volts.

3. The Doherty power amplifier of claim 2, wherein the second bias voltage is 28 volts.

4. The Doherty power amplifier of claim 1, wherein the carrier-path driver stage transistor and the carrier-path final stage transistor are integrated into a semiconductor die, wherein the semiconductor die is a silicon-based die, the carrier-path driver stage transistor is a first laterally-diffused metal oxide semiconductor (LDMOS) field effect transistor (FET), and the carrier-path final stage transistor is a second LDMOS FET.

5. The Doherty power amplifier of claim 1, wherein the carrier-path driver stage transistor is integrated into a first semiconductor die, wherein the semiconductor die is a silicon-based die, the carrier-path driver stage transistor is a first laterally-diffused metal oxide semiconductor (LDMOS) field effect transistor (FET), and the carrier-path final stage transistor is integrated into a second semiconductor die, wherein the second semiconductor die is a III-V-based semiconductor die.

6. A Doherty power amplifier comprising:
   a carrier-path driver stage transistor integrated in a first semiconductor die and having a driver stage input and a driver stage output, wherein the carrier-path driver stage transistor is configured to operate using a first bias voltage at the driver stage output of the carrier-path driver stage transistor, and the carrier-path driver stage transistor has a first breakdown voltage and a first output impedance;
   a carrier-path final stage transistor integrated in the first semiconductor die and having a final stage input and a final stage output, wherein the final stage input of the carrier-path final stage transistor is electrically coupled to the driver stage output of the carrier-path driver stage transistor, and the carrier-path final stage transistor is configured to operate using a second bias voltage at the final stage output of the carrier-path final stage transistor, and the second bias voltage is at least twice as large as the first bias voltage;
   a peaking-path driver stage transistor integrated in a second semiconductor die and having a driver stage input and a driver stage output, wherein the peaking-path driver stage transistor is configured to operate using the second bias voltage at the driver stage output of the peaking-path driver stage transistor, and wherein the peaking-path driver stage transistor has a second breakdown voltage that is significantly higher than the first breakdown voltage of the carrier-path driver stage transistor, and a second output impedance that is significantly higher than the first output impedance of the carrier-path driver stage transistor; and
   a peaking-path final stage transistor integrated in the second semiconductor die and having a final stage input and a final stage output, wherein the final stage input of the peaking-path final stage transistor is electrically coupled to the driver stage output of the peaking-path driver stage transistor, and the peaking-path final stage transistor is configured to operate using the second bias voltage at the final stage output of the peaking-path final stage transistor.

7. The Doherty power amplifier of claim 6, wherein the first semiconductor die is a silicon-based die, the carrier-path driver stage transistor is a first laterally-diffused metal oxide semiconductor (LDMOS) field effect transistor (FET), and the carrier-path final stage transistor is a second LDMOS FET.

8. The Doherty power amplifier of claim 1, wherein:
the carrier-path final stage transistor has a first input impedance;
the peaking-path final stage transistor has a second input impedance;
and the amplifier further comprises
a first interstage impedance matching network coupled between the driver stage output of the carrier-path driver stage transistor and the final stage input of the carrier-path final stage transistor, wherein the first interstage impedance matching circuit is configured to match the first output impedance of the carrier-path driver stage transistor to the first input impedance of the carrier-path final stage transistor, and the first interstage impedance matching circuit is characterized by a first impedance transformation ratio; and
a second interstage impedance matching network coupled between the driver stage output of the peaking-path driver stage transistor and the final stage input of the peaking-path final stage transistor, wherein the second interstage impedance matching circuit is configured to match the second output impedance of the peaking-path driver stage transistor to the second input impedance of the peaking-path final stage transistor, and the second interstage impedance matching circuit is characterized by a second impedance transformation ratio that is significantly higher than the first impedance transformation ratio.

9. The Doherty power amplifier of claim 8, wherein:
the first impedance transformation ratio is less than 10:1; and
the second impedance transformation ratio is between 30:1 and 50:1.

10. The Doherty power amplifier of claim 1, wherein the first output impedance is less than 10 ohms and the second output impedance is at least 60 ohms.

11. The Doherty power amplifier of claim 1, wherein:
the carrier-path driver stage transistor has a first breakdown voltage and a first drain-source on resistance; and
the carrier-path final stage transistor has a second breakdown voltage that is significantly higher than the first breakdown voltage, and a second drain-source on resistance that is significantly greater than the first drain-source on resistance.

12. The Doherty power amplifier of claim 11, wherein:
the carrier-path driver stage transistor has a first drift region length; and
the carrier-path final stage transistor has a second drift region length that is significantly longer than the first drift region length.

13. The Doherty power amplifier of claim 1, wherein:
the carrier-path driver stage transistor has a first drift region length; and
the peaking-path driver stage transistor has a second drift region length that is significantly longer than the first drift region length.

14. The Doherty power amplifier of claim 6, wherein:
the carrier-path final stage transistor has a first input impedance;
the peaking-path final stage transistor has a second input impedance;
and the amplifier further comprises
a first interstage impedance matching network coupled between the driver stage output of the carrier-path driver stage transistor and the final stage input of the carrier-path final stage transistor, wherein the first interstage impedance matching circuit is configured to match the first output impedance of the carrier-path driver stage transistor to the first input impedance of the carrier-path final stage transistor, and the first interstage impedance matching circuit is characterized by a first impedance transformation ratio; and
a second interstage impedance matching network coupled between the driver stage output of the peaking-path driver stage transistor and the final stage input of the peaking-path final stage transistor, wherein the second interstage impedance matching circuit is configured to match the second output impedance of the peaking-path driver stage transistor to the second input impedance of the peaking-path final stage transistor, and the second interstage impedance matching circuit is characterized by a second impedance transformation ratio that is significantly higher than the first impedance transformation ratio.

15. The Doherty power amplifier of claim 14, wherein:
the first impedance transformation ratio is less than 10:1; and
the second impedance transformation ratio is between 30:1 and 50:1.

16. The Doherty power amplifier of claim 6, wherein the first output impedance is less than 10 ohms and the second output impedance is at least 60 ohms.

17. The Doherty power amplifier of claim 6, wherein:
the carrier-path driver stage transistor has a first breakdown voltage and a first drain-source on resistance; and
the carrier-path final stage transistor has a second breakdown voltage that is significantly higher than the first breakdown voltage, and a second drain-source on resistance that is significantly greater than the first drain-source on resistance.

18. The Doherty power amplifier of claim 17, wherein:
the carrier-path driver stage transistor has a first drift region length; and
the carrier-path final stage transistor has a second drift region length that is significantly longer than the first drift region length.

19. The Doherty power amplifier of claim 6, wherein:
the carrier-path driver stage transistor has a first drift region length; and
the peaking-path driver stage transistor has a second drift region length that is significantly longer than the first drift region length.

* * * * *